(12) United States Patent
DeSimone et al.

(10) Patent No.: US 10,311,940 B2
(45) Date of Patent: *Jun. 4, 2019

(54) NULLIFYING INCORRECT SAMPLED DATA CONTRIBUTION IN DECISION FEEDBACK EQUALIZER AT RESTART OF FORWARDED CLOCK IN MEMORY SYSTEM

(71) Applicant: Integrated Device Technology, Inc., San Jose, CA (US)

(72) Inventors: Craig DeSimone, Dacula, GA (US); Praveen Singh, Alphareatta, GA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/850,311

(22) Filed: Dec. 21, 2017

(65) Prior Publication Data

US 2018/0114564 A1   Apr. 26, 2018

Related U.S. Application Data

(63) Continuation of application No. 15/367,968, filed on Dec. 2, 2016, now Pat. No. 9,865,328.

(Continued)

(51) Int. Cl.
*G11C 11/40* (2006.01)
*G11C 11/4093* (2006.01)
(Continued)

(52) U.S. Cl.
CPC ............ *G11C 11/4093* (2013.01); *G06F 1/04* (2013.01); *G11C 5/04* (2013.01); *G11C 7/1066* (2013.01);
(Continued)

(58) Field of Classification Search
CPC ....... G11C 5/04; G11C 7/1066; G11C 7/1093; G11C 11/4072; G11C 11/4076;
(Continued)

(56) References Cited

U.S. PATENT DOCUMENTS 5,386,391 A * 1/1995 Watanabe ................ G11C 5/14
    365/189.05
5,995,430 A * 11/1999 Yabe ........................ G11C 7/10
    365/189.05

(Continued)

*Primary Examiner* — Tan T. Nguyen
(74) *Attorney, Agent, or Firm* — Christopher P. Maiorana, PC

(57) ABSTRACT

An apparatus includes a receiver circuit and a data buffer. The receiver circuit may comprise a decision feedback equalizer (DFE). The data buffer circuit may be configured to initialize a condition of the receiver circuit in response to a control signal prior to reception of a command sequence associated with a directed access to a memory system. The control signal generally indicates detection of a non-consecutive clock associated with a start of the command sequence. The data buffer circuit may generate one or more tap enable signals configured to determine a number of clock cycles during which a contribution of one or more taps of the decision feedback equalizer (DFE) are delayed.

18 Claims, 21 Drawing Sheets

Related U.S. Application Data

(60) Provisional application No. 62/372,922, filed on Aug. 10, 2016, provisional application No. 62/372,906, filed on Aug. 10, 2016, provisional application No. 62/263,590, filed on Dec. 4, 2015, provisional application No. 62/263,581, filed on Dec. 4, 2015.

(51) Int. Cl.
| | |
|---|---|
| *H04L 25/03* | (2006.01) |
| *G06F 1/04* | (2006.01) |
| *G11C 11/4076* | (2006.01) |
| *G11C 11/4096* | (2006.01) |
| *G11C 5/04* | (2006.01) |
| *G11C 7/10* | (2006.01) |
| *G11C 11/4072* | (2006.01) |

(52) U.S. Cl.
CPC ........ *G11C 7/1093* (2013.01); *G11C 11/4072* (2013.01); *G11C 11/4076* (2013.01); *G11C 11/4096* (2013.01); *H04L 25/03057* (2013.01)

(58) Field of Classification Search
CPC ... G11C 11/4093; G11C 11/4096; G06F 1/04; H04L 25/03057
USPC .......... 365/189.05, 193, 194, 233.1
See application file for complete search history.

(56) References Cited

U.S. PATENT DOCUMENTS

| | | | |
|---|---|---|---|
| 6,209,071 B1 | 3/2001 | Barth | 711/105 |
| 7,292,629 B2 | 11/2007 | Zerbe | 375/229 |
| 9,257,164 B2 | 2/2016 | Maryan | |
| 9,389,637 B2 | 7/2016 | Nguyen | |
| 9,473,259 B2 | 10/2016 | Levin | |
| 9,860,088 B1* | 1/2018 | DeSimone | H04L 25/03057 |
| 9,865,328 B1* | 1/2018 | DeSimone | H04L 25/03057 |
| 2002/0167859 A1* | 11/2002 | Chun | G11C 7/12 |
| | | | 365/233.1 |
| 2013/0083611 A1* | 4/2013 | Ware | G11C 11/4072 |
| | | | 365/191 |
| 2016/0103620 A1 | 4/2016 | Kim | 711/105 |

* cited by examiner

TABLE 1

| CSR BIT | | DYNAMIC SYGNALS @ RTL TO CUSTOM | | CUSTOM BEHAVIOR | | | | |
|---|---|---|---|---|---|---|---|---|
| TAP1_FORCE_PREAMBLE_SAMPLING | BCOM_W2W_SPACED_1_DQDEADCYCLE | IS W2W_SPACED_1_DQDEADCYCLE? | IS B2B COMMAND? | TAP1 | TAP2 | TAP3 | TAP4 | COMMENT |
| 0 | 0 | X | NO | RST/WARMUP | RST/WARMUP | RST/WARMUP | RST/WARMUP | WRITE COMMAND AFTER BUS SETTLED TO VDD. TAP2-4 CAN ONLY RESET OR WARMUP AS NO CLOCK AVAILABLE. |
| 0 | 1 | YES | NO | FREE RUNNING | FREE RUNNING | FREE RUNNING | FREE RUNNING | FREERUNNING WITH DQS RAW, DESPITE FACT THAT DQS CLEAN IS MISSING PULSE HIGH IN PREAMBLE |
| 1 | X | X | NO | LATCHED @ DQS PRE FALLING | X | X | X | USE DQS FALLING IN 1T MODE TO LOAD TAP1 |
| X | X | X | YES | FREE RUNNING | FREE RUNNING | FREE RUNNING | FREE RUNNING | FREERUNNING WITH DQS RAW / DQS CLEAN |

TABLE 2

LOGIC TABLE FOR GAP1_SMOOTH

| INPUTS TO FSM | | | | | | | PER NIBBLE OUTPUT TO CUSTOM | EFFECT |
|---|---|---|---|---|---|---|---|---|
| STATIC CONFIGURATION BITS (E.G., FROM CSR) | | | EFFECTIVE MRS | | CAPTURED BCOM | | | |
| FORCE_DFE_FREERUN | DFE_GAP1_SMOOTH_EN | GAP1_CHG_DAT0_RNK | EFFECTIVE HOST WRITE PREAMBLE | MR2.A12 WRITE CRC | LAST WRITE BURST LENGTH | WR TO WR SPACING | GAP1_SMOOTH | |
| 0 | 0 | X | X | X | X | X | 0 | STATICALLY DISABLED (ALWAYS) |
| 1 | X | X | X | X | X | X | 1 | STATICALLY ASSERTED (ALWAYS) FOR FREERUNNING |
| 0 | 1 | X | 2T | X | X | X | 0 | STATICALLY DISABLED (ALWAYS) IN 2T |
| 0 | 1 | 0 | 1T | DISABLE | BC4 | 5 | 0 | DYNAMICALLY DISABLED (ALWAYS) |
| 0 | 1 | 0 | 1T | DISABLE | BL8 | 6 | 1 | OUTPUT ASSERTED DYNAMICALLY |
| 0 | 1 | X | 1T | ENABLE | X | | 1 | |
| OTHERS (DEFAULT CASE) | | | | | | | 0 | ALL OTHER CASES |

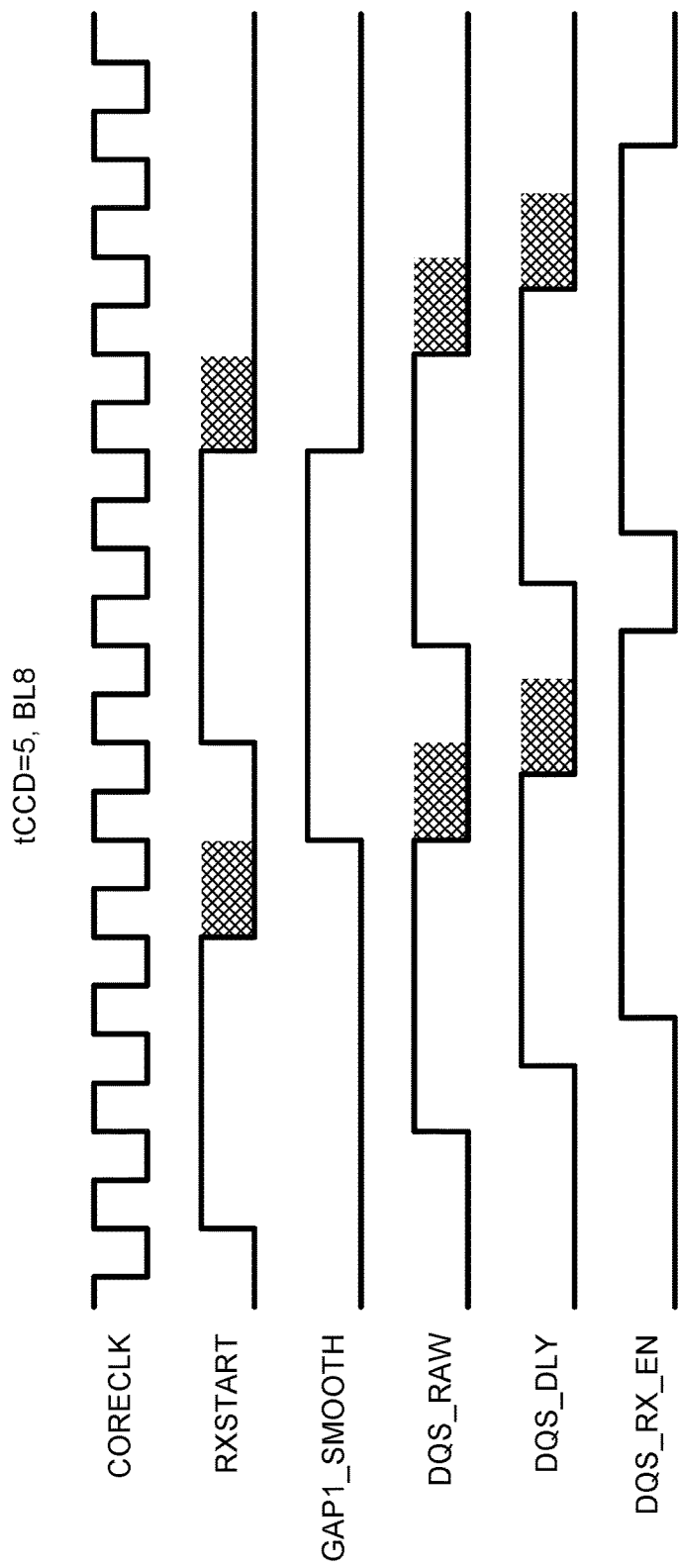

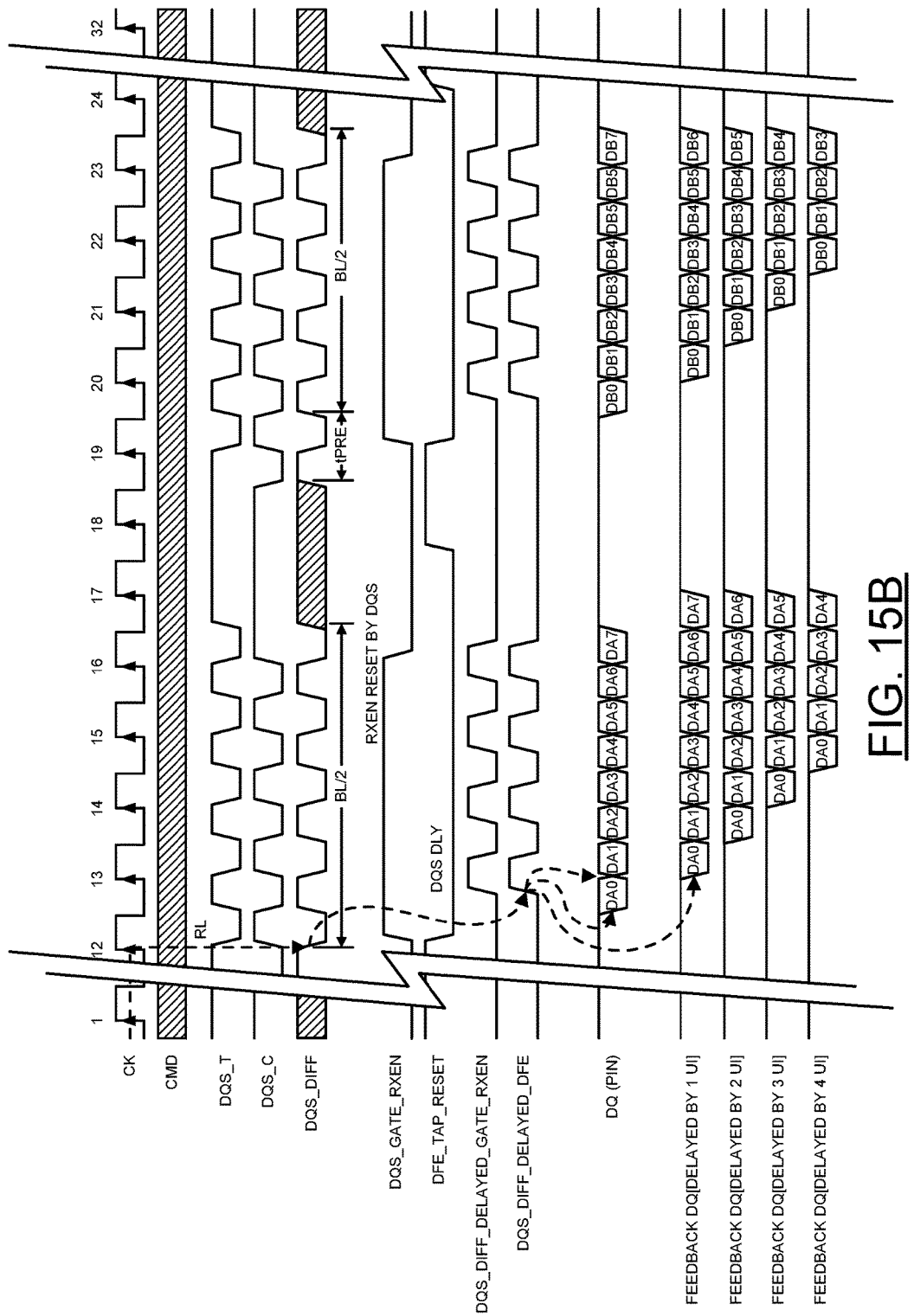

US 10,311,940 B2

NULLIFYING INCORRECT SAMPLED DATA CONTRIBUTION IN DECISION FEEDBACK EQUALIZER AT RESTART OF FORWARDED CLOCK IN MEMORY SYSTEM

This application relates to U.S. Ser. No. 15/367,968, filed Dec. 2, 2016, which relates to U.S. Provisional Application No. 62/263,590, filed Dec. 4, 2015, U.S. Provisional Application No. 62/263,581, filed Dec. 4, 2015, U.S. Provisional Application No. 62/372,906, filed Aug. 10, 2016, and U.S. Provisional Application No. 62/372,922, filed Aug. 10, 2016, which are hereby incorporated by reference in their entirety.

FIELD OF THE INVENTION

The present invention relates to digital receivers generally and, more particularly, to a method and/or apparatus to nullify incorrect sampled data contribution in a decision feedback equalizer (DFE) at restart of a forwarded clock in a memory system.

BACKGROUND

Past decisions need to be accurately sampled in application of a decision feedback equalizer (DFE). A non-consecutive sampling clock occurs from forwarded source-synchronous clock implementation of fourth generation double data rate (DDR4) memory specification. The forwarded source-synchronous clock will be restarted following a targeted access command. With conventional techniques, a maximum DFE margin will not be equalized due to error propagation of stale or incorrect past history at the first data transition bit, causing a margin reduction.

It would be desirable to implement a method and/or apparatus to nullify incorrect sampled data contribution in a decision feedback equalizer (DFE) at restart of forwarded clock in a memory system.

SUMMARY

The present invention concerns an apparatus including a receiver circuit and a data buffer. The receiver circuit may comprise a decision feedback equalizer (DFE). The data buffer circuit may be configured to initialize a condition of the receiver circuit in response to a control signal prior to reception of a command sequence associated with a directed access to a memory system. The control signal generally indicates detection of a non-consecutive clock associated with a start of the command sequence. The data buffer circuit may generate one or more tap enable signals configured to determine a number of clock cycles during which a contribution of one or more taps of the decision feedback equalizer (DFE) are delayed.

BRIEF DESCRIPTION OF THE FIGURES

Embodiments of the invention will be apparent from the following detailed description and the appended claims and drawings in which:

FIG. 8 is a logic table illustrating an example implementation of a control logic of FIG. 4;

FIG. 9 is a logic table illustrating an example implementation of a finite state machine of the control logic of FIG. 4;

FIG. 10 is a diagram illustrating an operation in accordance with an example embodiment;

FIGS. 15A-15B are diagrams illustrating an operation in accordance with an example embodiment.

DETAILED DESCRIPTION OF THE EMBODIMENTS

Embodiments of the present invention include providing a method and/or apparatus to nullify incorrect sampled data contribution in DFE at restart of forwarded clock in memory system that may (i) generate a tap load control signal from a combination of command signal-generation, (ii) synchronize the tap load control signal to a forwarded source-synchronous pin clock (e.g., DQS), (iii) improve DFE margin, (iv) asynchronously reset taps to a termination level, (v) prevent tap contribution until known good data has been registered, and/or (vi) be implemented in one or more integrated circuits. For example, in one embodiment, the present invention includes providing a method and/or apparatus to nullify incorrect sampled data contribution in DFE at restart of a forwarded clock in a DDR4 pseudo open drain bus application.

Figure 1:
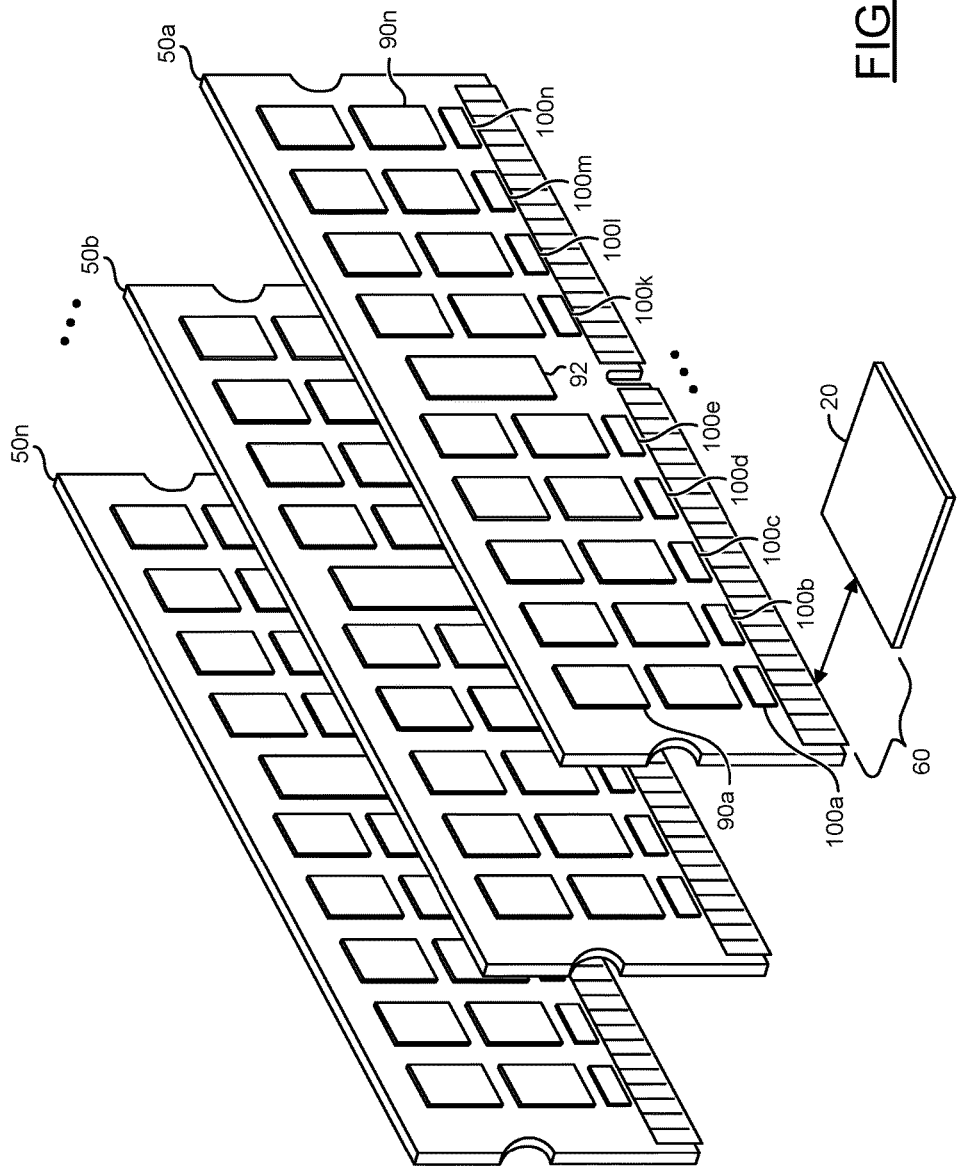
FIG. 1 is a diagram illustrating an example embodiment of a memory system.

Referring to FIG. 1, a diagram of a memory system is shown in accordance with an example embodiment of the invention. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fourth generation (DDR4) synchronous dynamic random-access memory (SDRAM) modules. In various embodiments, the circuits 50a-50n may comprise a number of blocks (or circuits) 90a-90n, a block (or circuit) 92, a number of blocks (or circuits) 100a-100n, and/or various other blocks, circuits, pins, connectors and/or traces. The circuits 90a-90n may implement memory devices. In an example, the circuits 90a-90n may be implemented as synchronous dynamic random-access memory (SDRAM) devices (or chips, or modules). The circuit 92 may be implemented as a registered clock driver (RCD). In an example, the RCD circuit 92 may be implemented as a DDR4 RCD circuit. The circuits 100a-100n may be configured as data buffers. The type, arrangement and/or number of components of the memory modules 50a-50n may be varied to meet the design criteria of a particular implementation.

The memory modules 50a-50n are shown connected to a block (or circuit) 20. The circuit 20 may implement a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard (or main board). In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR4 SDRAM memory modules. In an example, the circuits 50a-50n may have a memory module density of 512 gigabyte (GB), one terabyte (TB), or higher per module (e.g., compared to 128 GB per dual in-line memory module (DIMM) in DDR3). In embodiments implementing DDR4 SDRAM memory modules, the circuits 50a-50n may operate at voltages of 1.2-1.35 volts (V) with a frequency between 800-2133 megahertz (MHZ) (e.g., compared to 1.5-1.65V at frequencies between 400-1067 MHZ in DDR3). In some embodiments, the circuits 50a-50n may be implemented as low voltage DDR4 memory modules and operate at 1.05V. For example, in embodiments implementing low voltage DDR4 SDRAM memory modules, the circuits 50a-50n may implement 35% power savings compared to DDR3 memory. In embodiments implementing DDR4 SDRAM memory modules, the circuits 50a-50n may transfer data at speeds of 2.13-4.26 gigatransfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification entitled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM). The data buffers 100a-100n may allow the memory modules 50a-50n to operate at higher bandwidth and/or at higher capacities compared to DDR4 RDIMM (e.g., 2400 or 2666 MT/s for DDR4 LRDIMM compared to 2133 or 2400 MT/s for DDR4 RDIMM at 384 GB capacity). For example, compared to DDR4 RDIMM configurations, the DDR4 LRDIMM configuration of the memory modules 50a-50n may allow improved signal integrity on data signals and/or better intelligence and/or post-buffer awareness by the memory controller 20.

Figure 2:
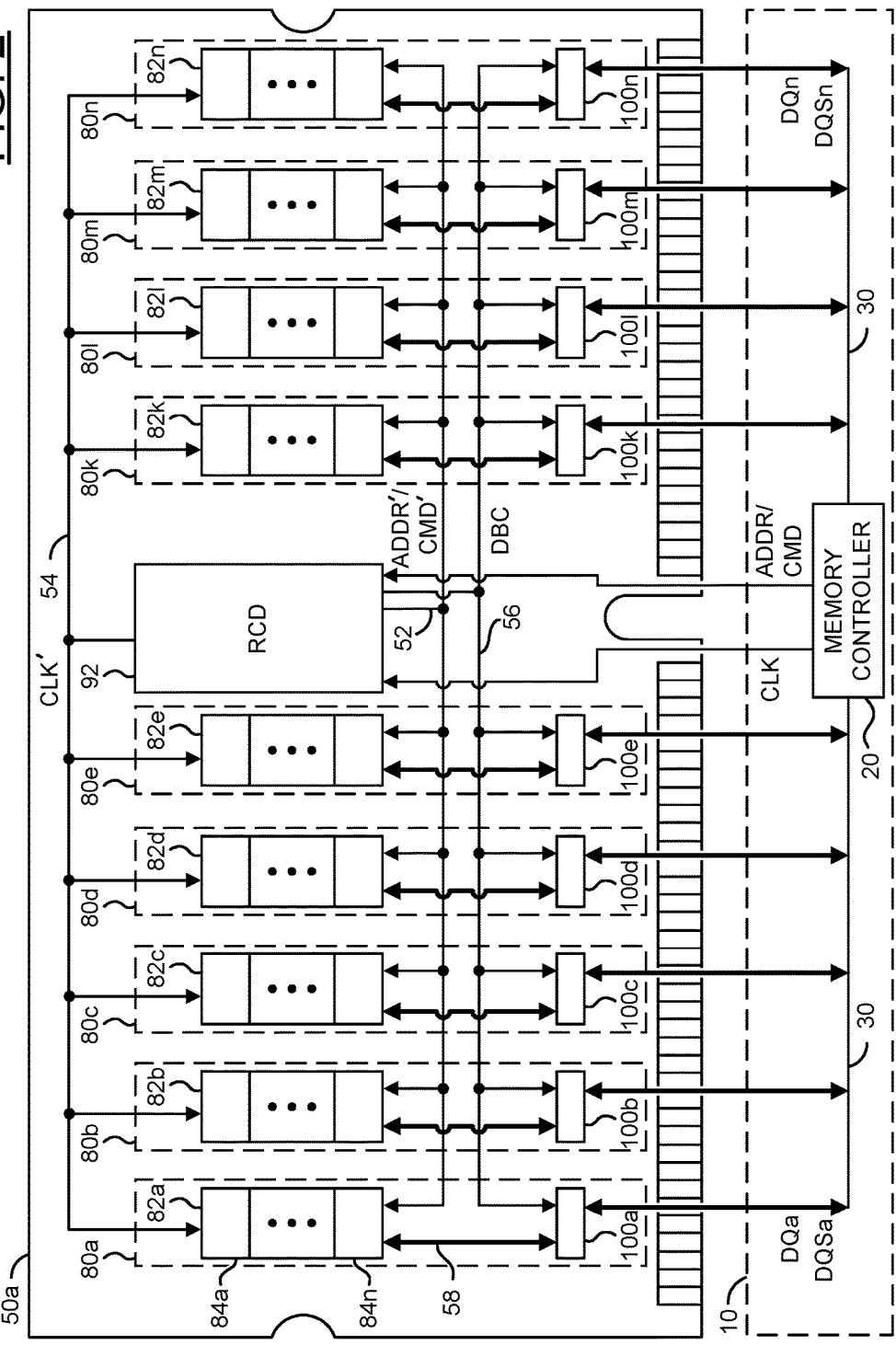
FIG. 2 is a block diagram illustrating a memory module of FIG. 1.

Referring to FIG. 2, a block diagram is shown illustrating a memory module 50a of FIG. 1. The memory module 50a may be representative of the memory modules 50b-50n. The memory module 50a is shown communicating with the memory controller 20. The memory controller 20 is shown as part of a block (or circuit) 10. The circuit 10 may be a motherboard (or main board), or other electronic component or computing engine that communicates with the memory module 50a.

The memory module 50a may comprise one or more blocks (or circuits) 80a-80n and/or the RCD circuit 92. The circuits 80a-80n may implement data paths of the memory module 50a. For example, the data path 80a may include a block 82a and/or the data buffer 100a. The data paths 80b-80n may have similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 92. A data bus 30 may be connected between the memory controller 20 and the data paths 80a-80n. The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n.

The RCD circuit 92 may be configured to communicate with the memory controller 20, the memory channels 82a-82n and/or the data buffers 100a-100n. The RCD circuit 92 may decode instructions received from the memory controller 20. For example, the RCD circuit 92 may receive register command words (RCWs). In another example, the RCD circuit 92 may receive buffer control words (BCWs). The RCD circuit 92 may be configured to train the DRAM chips 84a-84n, the data buffers 100a-100n and/or command and address lines between the RCD circuit 92 and the memory controller 20. For example, the RCWs may flow from the memory controller 20 to the RCD circuit 92. The RCWs may be used to configure the RCD circuit 92.

The RCD circuit 92 may be used in both LRDIMM and RDIMM configurations. The RCD circuit 92 may implement a 32-bit 1:2 command/address register. The RCD circuit 92 may support an at-speed bus (e.g., a BCOM bus between the RCD circuit 92 and the data buffers 100a-100n). The RCD circuit 92 may implement automatic impedance calibration. The RCD circuit 92 may implement command/address parity checking. The RCD circuit 92 may control register RCW readback. The RCD circuit 92 may implement a 1 MHz inter-integrated circuit ($I^2C$) bus (e.g., a serial bus). Inputs to the RCD circuit 92 may be pseudo-differential using external and/or internal voltages. The clock outputs, command/address outputs, control outputs and/or data buffer control outputs of the RCD circuit 92 may be enabled in groups and independently driven with different strengths.

The RCD circuit 92 may receive the signal CLK and/or the signals ADDR/CMD from the memory controller 20. Various digital logic components of the RCD circuit 92 may be used to generate signals based on the signal CLK and/or the signals ADDR/CMD and/or other signals (e.g., RCWs). The RCD circuit 92 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals ADDR'/CMD' and CLK' may be transmitted on a common bus 52 and a common bus 54, respectively. The RCD circuit 92 may generate one or more signals (e.g., DBC). The signals DBC may be presented to the data buffers 100a-100n. The signals DBC may implement data buffer control signals. The signals DBC may be transmitted on a common bus 56 (e.g., a data buffer control bus).

The data buffers 100a-100n may be configured to receive commands and data from the bus 56. The data buffers 100a-100n may be configured to generate/receive data to/from the bus 30. The bus 30 may comprise traces, pins and/or connections between the memory controller 20 and the data buffers 100a-100n. A bus 58 may carry the data between each of the data buffers 100a-100n and respective memory channels 82a-82n. The data buffers 100a-100n may be configured to buffer data on the buses 30 and 58 for write operations (e.g., data transfers from the memory controller 20 to the corresponding memory channels 82a-82n. The data buffers 100a-100n may be configured to buffer data on the buses 30 and 58 for read operations (e.g., data transfers from the corresponding memory channels 82a-82n to the memory controller 20).

The data buffers 100a-100n may exchange data with the DRAM chips 84a-84n in small units (e.g., 4-bit nibbles). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 100a-100n through an upper nibble and a lower nibble. For two set/four DRAM chip (e.g., 84a-84d) implementations, each set may contain two DRAM chips (e.g., 84a-84b or 84c-84d). A first set may be connected to the respective data buffers 100a-100n through the upper nibble. The other set may be connected to the respective data buffers 100a-100n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 100a-100n through the upper nibble. The other set of four DRAM chips (e.g., 84e-84h) may connect to the respective data buffers 100a-100n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 100a-100n may allow DDR4 LRDIMM designs to implement shorter I/O trace lengths compared to DDR3 LRDIMM designs, which use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), which is 50% less latency than DDR3 buffer memory). In yet another example, the shorter traces may reduce I/O bus turnaround time. For example, without the distributed data buffers 100a-100n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 100a-100n. The memory modules 50a-50n may implement 2 millimeter (mm) frontside bus traces and backside traces (e.g., the connectors/pins/traces 60). A propagation delay through the data buffers 100a-100n may be 33% faster than through a DDR3 memory buffer (e.g., resulting in reduced latency). In some embodiments, the data buffers 100a-100n may be smaller (e.g., a reduced area parameter) than a data buffer used for DDR3 applications.

Figure 3:
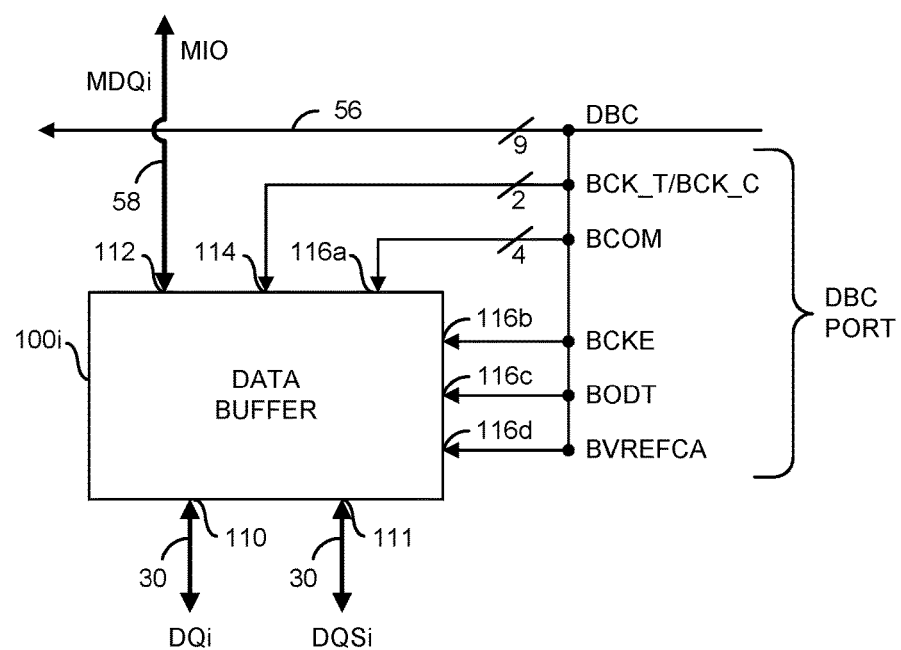
FIG. 3 is a block diagram illustrating an example data buffer of FIG. 1.

Referring to FIG. 3, a diagram is shown illustrating a data buffer 100i in accordance with an example embodiment of the invention. The data buffer 100i may be representative of an example embodiment of the data buffers 100a-100n. The data buffer 100i is shown having a first input/output 110, a second input/output 111, and a third input/output 112.

The first input/output 110 is configured for presenting/receiving the signals DQi (e.g., the data signals DQ corresponding to a memory channel) between the data buffer 100i and the controller 20. The second input/output 111 is configured for presenting/receiving the signals DQSi (e.g., the data strobe signals DQS corresponding to the memory channel) between the data buffer 100i and the controller 20. The third input/output 112 is configured for presenting/receiving the signals DQi as memory input/output (MIO) signals (e.g., MDQi) corresponding to a memory channel between the data buffer 100i and the respective memory devices (e.g., DRAM chips) 90a-90n.

The signals MIO are generally transmitted between the memory modules 90a-90n and the respective data buffer 100a-100n. In an example, data (e.g., the signals DQi) from the memory controller 20 may be presented to the data buffer 100i, buffered in the data buffer 100i, then transmitted to the respective memory device(s) 90a-90n. In another example, data from the respective memory device(s) 90a-90n may be presented to the data buffer 100i, buffered in the data buffer 100i, and then transmitted on an appropriate memory channel to the memory controller 20.

The data buffer 100i is shown also receiving signals (e.g., DBC) from the bus 56 at a control port (e.g., DBC PORT). The signals DBC may be presented to the data buffers 100a-104n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 100i is shown having an input 114 receiving the signals BCK_T/BCK_C, an input 116a receiving the signal BCOM, an input 116b receiving the signal BCKE, an input 116c receiving the signal BODT, and an input 116d receiving the signal BVREFCA.

In various embodiments, the signals BCK_T/BCK_C may be implemented as a 2-bit signal representing a differential (e.g., true (T) and complementary (C) versions) clock signal for the duplex data buffers 100a-100n. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 92 to the data buffers 100a-100n. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The data buffers 100a-100n may receive a set of data buffer commands (e.g., for writing buffer control words (BCWs)) from the signals DBC. The buffer control words may be used to customize operation of the data buffers 100a-100n. The buffer control words may flow from the memory controller 20, through the RCD circuit 92, to the data buffers 100a-100n. The buffer control words may be similar to register control words (RCWS) used for configuring the RCD circuit 92. Similar to commands for writing the register control words, the commands for writing the buffer control words may look like an MRS7 command, where the address lines are really the payload.

In embodiments where the bus 56 comprises nine pins, the RCD circuit 92 may do more than pass a buffer control word directly through to the data buffers 100a-100n. In one example, the RCD circuit 92 may convert (e.g., multiplex) an MRS7 command format into a buffer control word in a BCOM format. The RCD circuit 92 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 100a-100n, the data buffers 100a-100n may decode the buffer control word, write the buffer control word to a function space of the data buffer, and complete the buffer command in the buffer control word.

A function of the signal BCOM may be to transmit the buffer control words. However, compliant with the JEDEC specification for DDR4 SDRAM, the RCD circuit 92 may send all read/write commands and MRS information over the bus 56 (e.g., to allow the data buffers 100a-100n to keep track of what the memory devices 90 are doing). In some embodiments, different buffer commands may take a different number of cycles to transfer the information.

The RCD circuit 92 may receive an MRS7 command from the memory controller 20 (e.g., from a host). For example, a host may want to change a parameter (e.g., typically on initialization or boot up of a computing device).

The RCD circuit 92 may check the MRS7 command to determine whether the address bit 12 is set to 1 (e.g., a logical one). In an example, when an address bit 12 of the MRS7 command is set to 1, the RCD circuit 92 may recognize the command as a buffer command (e.g., a command that is not meant for the RCD circuit 92). The RCD circuit 92 may convert the command from the memory controller 20 to a buffer control word and send the buffer control word to the data buffers 100a-100n via the bus 56. The data buffers 100a-100n may write the buffer control word to a function space to complete the command.

The data buffers 100a-100n may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 100a-100n may be decided based on system level configurations. Generally, most of the configuration of the data buffers 100a-100n may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 100a-100n. The bus 56 may also send commands (e.g., data reads and/or data writes) that control data traffic through the data buffers 100a-100n. For example, some commands may optimize power consumption and noise filtering (e.g. equalization) of the data buffers 100a-100n. In another example, read/write delays may be added per data line.

The data buffers 100a-100n may implement dual multi-bit (e.g., 4-bit) bidirectional data registers with differential data strobes (e.g., DQS_T/DQS_C). The data buffers 100a-100n may implement automatic impedance calibration. The data buffers 100a-100n may implement BCOM parity checking. The data buffers 100a-100n may implement control register (e.g., buffer control word) readback.

Figure 4:
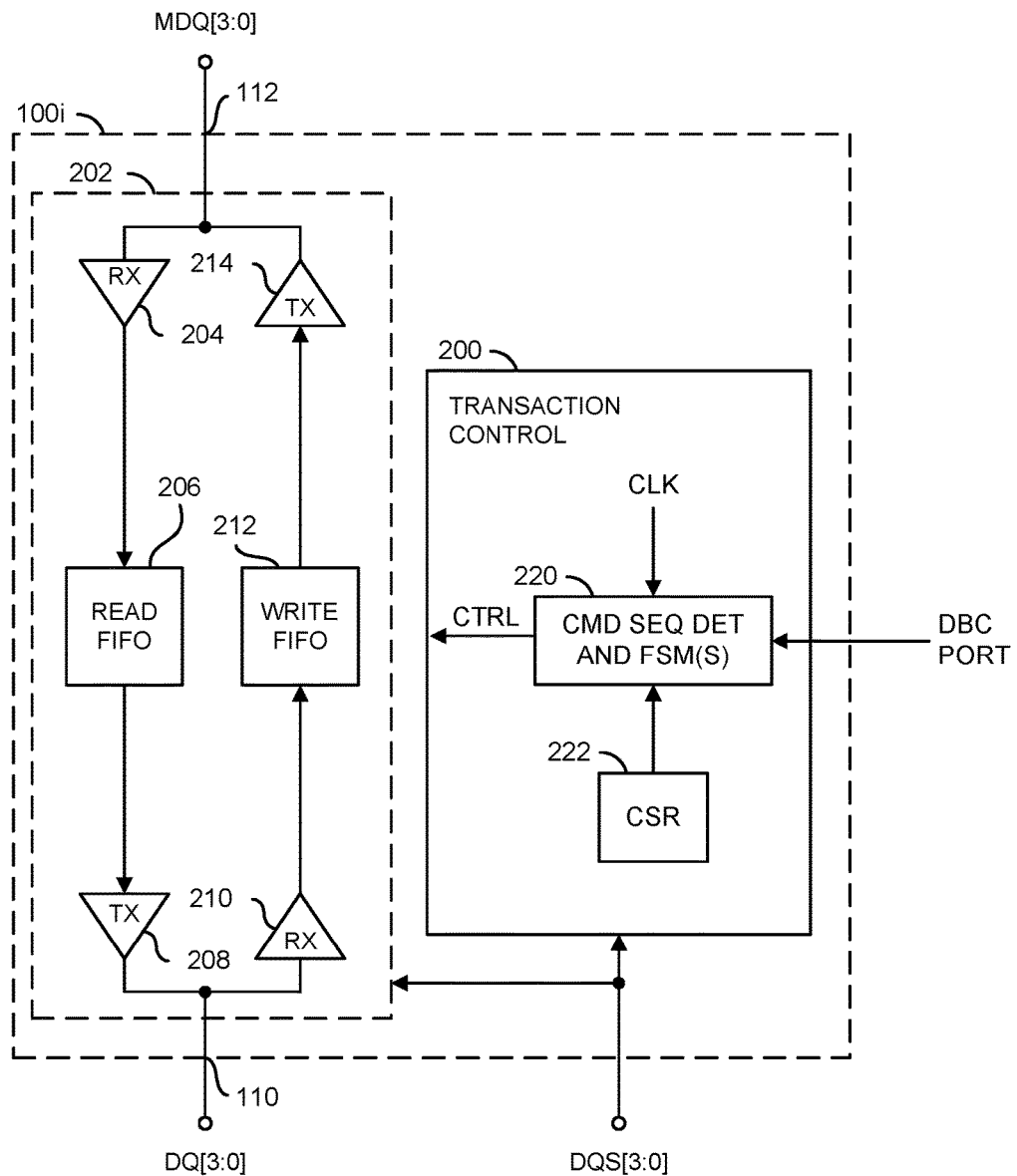
FIG. 4 is a block diagram illustrating an example implementation of a data buffer in accordance with an example embodiment of the invention.

Referring to FIG. 4, a diagram is shown illustrating an example implementation of a data buffer 100i in accordance with an example embodiment of the invention. The data buffers 100a-100n may be implemented as illustrated by the data buffer 100i. In an example, the data buffer 100i may comprise a block 200 and a block 202. The block 200 may implement a transaction control logic of the data buffer 100i. The block 202 may implement channel circuitry for the data buffer 100i. The block 200 may be configured to control operations of the data buffer 100i based upon commands received via the DBC port. The circuit 200 is generally enabled to configure the circuit 202 for operation. The circuit 200 may be configured to implement the data buffer control (DBC) port described above in connection with FIG. 3.

In one example, the block 202 may be used to provide the data path between the memory devices 90a-90n and the memory controller 20. In various embodiments, the block 202 comprises a block (or circuit) 204, a block (or circuit) 206, a block (or circuit) 208, a block (or circuit) 210, a block (or circuit) 212, and a block (or circuit) 214. The block 204 and the block 210 may be implemented as receivers or buffers. The block 208 and the block 214 may be implemented as transmitters or buffer/drivers. The blocks 206 and 212 may be implemented as memories. The memories 206 and 212 may be configured as first-in first-out (FIFO) memories. In some embodiments, the memories 206 and 212 may be implemented as separate, independent memory blocks or devices. In some embodiments, the memories 206 and 212 may be implemented as portions of a single memory block or device.

In one example, the input/output 112 may be connected to an input of the block 204 and an output of the block 214. An output of the block 204 may be connected to an input of the block 206. An input of the block 214 may be connected to an output of the block 212. An output of the block 206 may be connected to a an input of the block 208. An input of the block 212 may be connected to an output of the block 210. An output of the block 208 and an input of the block 210 may be connected to the input/output 110.

The block 200 may comprise a block (or circuit) 220 and a block (or circuit) 222. In various embodiments, the circuit 220 may implement a control logic. In various embodiments, the circuit 220 may comprise a command sequence detector. In various embodiments, the circuit 220 may implement one or more finite state machines (FSMs) and/or combinatorial logic configured to manage operation of the data buffer 100i. An example of a FSM circuit that may be implemented in the circuit 220 may be found in co-pending U.S. application Ser. No. 15/367,742, filed Dec. 2, 2016, which is hereby incorporated by reference in its entirety. In one aspect, the circuit 220 may be configured for controlling decision feedback equalizers of the blocks 204 and 210. The block 222 may be implemented as one or more memory devices (e.g., configuration bits, registers, etc.). In an example, the block 222 may be configured to store configuration and status register (CSR) bits. In an example, the CSR bits may be programmed during initialization and/or training.

In various embodiments, the block 220 may be configured to generate a tap load control signal (e.g., CTRL). In various embodiments, the signal CTRL may be configured as a tap load signal. In an example, the block 220 may be configured to generate the signal CTRL based on a combination of command signals (e.g., received via the DBC port), CSR bits, and a forwarded source-synchronous pin clock (e.g., DQS). The block 220 is generally configured to facilitate detection of particular commands (e.g., write) to the block 220. The block 220 may monitor the DBC port for access commands (e.g., read, write, power-down, etc.) sent from the RCD circuit 92 to the data buffers 100a-100n on the bus 56. The block 222 is generally configured to present one or more CSR bits to the block 220 to facilitate a decision making process.

In various embodiments, the receivers 204 and 210 may include a decision feedback equalizer (DFE) implemented with a series of storage elements. The series of storage elements may have a length n equal to the number of taps of the DFE. In an example, the storage elements may be implemented as, but not limited to, synchronous logic (e.g., D-Flip-Flops) with an asynchronous load to logic 1 (e.g., referred to as SET). The D-Flip-Flops are generally connected serially (e.g., D to Q) to reflect the past decision history of the n taps. In various embodiments, the signal CTRL may be configured to control the asynchronous load of the storage elements. In an example, the general logic of the signal CTRL may be described by, but is not limited to, the following:

1) The signal CTRL to the D-Flip-Flops is asserted and deasserted synchronously to the signal DQS or by an internally-generated clock.
2) The signal CTRL may be asserted synchronous to the signal DQS by a signal generated relative to detection of a predetermined command sequence, which is asserted during a non-consecutive clock pattern on the DQS bus on the last expected DQS transition. Alternatively or in addition to, the signal CTRL may be asserted by means of an internal mesosynchronous clock source (e.g., independent from the signal DQS) for less timing accuracy in cases where command monitoring may not meet timing.
3) The command sequence may be detected using a finite state machine (FSM) of the circuit 220 monitoring the command bus (e.g., bus 56). In an example, the circuit 220 may monitor for a non-consecutive command sequence to the same device that describes the expected command sequence length. In some embodiments, the circuit 220 may use an independent local clock (e.g., CLK) to ensure a timing margin thru means of a clock domain crossing (CDC) or multiple cycle path when clocked by the signal DQS or the internally-generated clock mentioned in 1 above.
4) The signal CTRL is generally deasserted synchronous to a DQS restart by a signal setup from 3 and clocked by 1.
5) The signal CTRL is generally independently generated to cover unique cases where data may be dis-continuous but the pin clock DQS is continuous. For instance, the signal CTRL is generally not equivalent to, and is independent of a clock-gating signal generated for the data path.
6) The storage elements of the DFE may be an independent set of storage elements with respect to the data path to facilitate command spacings where data and feedback flops do not yield similar values (e.g., as described in 5).
7) The combination of 1 to 6 generates an equivalent correct history of logical level "1" to all storage elements when asserted on restart of a non-consecutive clock to match the pseudo open drain termination quiescent level on the bus to logic level 1, thus emulating the history correctly.

Figure 5:
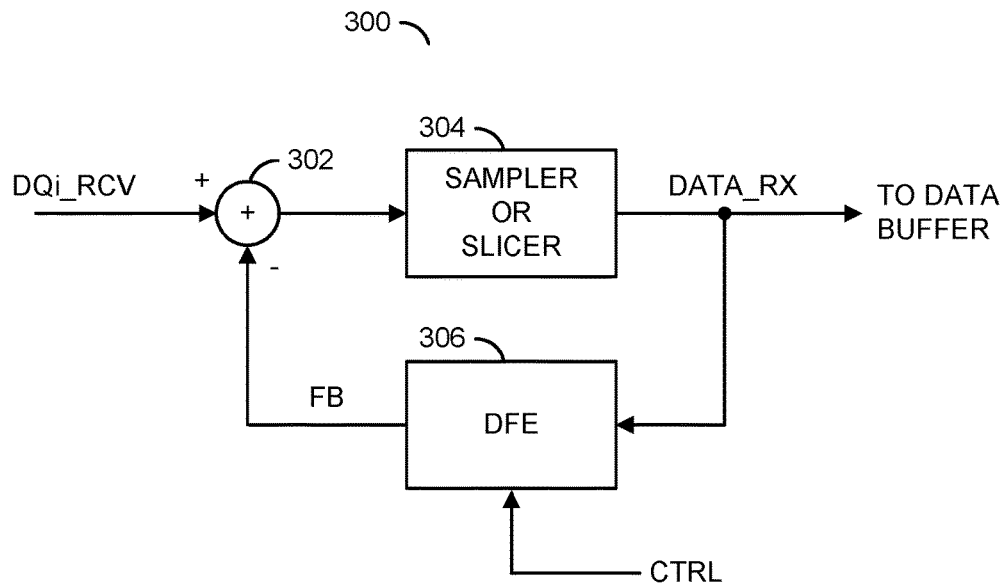
FIG. 5 is a diagram illustrating a portion of a receiver circuit in accordance with an example embodiment of the invention.

Referring to FIG. 5, a diagram is shown illustrating a portion of a receiver circuit of FIG. 4. In various embodiments, the receiver circuits 204 and 210 may comprise a circuit 300. The circuit 300 may be configured to reduce inter-symbol interference (ISI) in the DQ signals. In an example, the circuit 300 may comprise, inter alia, a block (or circuit) 302, a block (or circuit) 304, and a block (or circuit) 306. The block 302 may be implemented as an adder (or summing circuit). The block 304 may be implemented as a data sampler (or slicer). The block 306 may be implemented as a decision feedback equalizer (DFE).

A first input of the block 302 may receive a received data signal (e.g., DQi_RCV). A second input of the block 302 may receive a feedback signal (e.g., FB) from an output of the block 306. An output of the block 302 may present a difference of the received data signal DQi_RCV and the feedback signal FB to an input of the block 304. An output of the block 304 may present a data sample (e.g., DATA_RX) to a first input of the block 306 and to a separate data buffer of the receive path. The block 306 may receive the signal CTRL at a second input. The signal CTRL may be configured to control one or more data latches associated with filter taps of the block 306.

Figure 6:
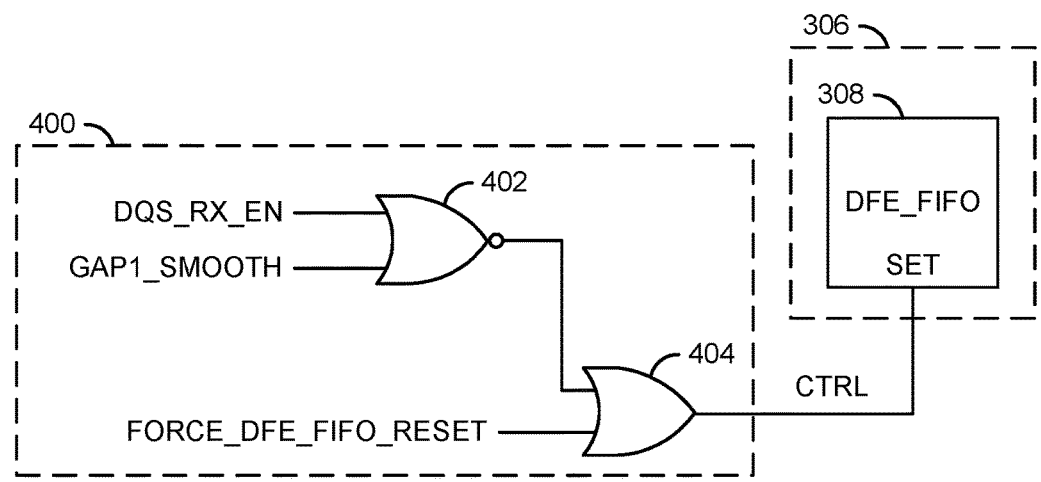
FIG. 6 is a diagram illustrating an example control logic implementing a reset signal of data latches in the FIFO data buffer of a decision feedback equalizer (DFE) of FIG. 5.

Referring to FIG. 6, a diagram is shown illustrating an example control logic implementing the tap load signal CTRL applied to data latches in a first-in-first-out (FIFO) data buffer 308 of the decision feedback equalizer (DFE) 306 of FIG. 5. A separate DFE FIFO (from data path FIFO) is generally used to provide data feedback to taps of the DFE. This separate FIFO data buffer 308 may be speed optimized and kept very close to the receiver to provide a quick feedback time. In various embodiments, the FIFO data buffer 308 is implemented as a number of series connected latches for even and odd data. In general, a receiver enable signal may be used to reset the DFE FIFO data buffer 308. For example, all the taps of the FIFO may be reset to 1 when the DQ bus is terminated to VDD. In various embodiments, a separate control logic 400 may be implemented to inhibit reset of the FIFO data buffer 308 in close gapping conditions.

In an example, the logic circuit 400 may be configured to generate the signal CTRL as a logical combination of a first control signal (e.g., DQS_RX_EN) and a second control signal (e.g., GAP1_SMOOTH). The signal DQS_RX_EN generally implements a receive enable signal for identifying a timing window for the receiving device to enable data capture circuitry while a known/valid level is present on the DQS strobe signal, thus avoiding false triggers of the capture circuit. The signal GAP1_SMOOTH generally indicates detection of a predetermined condition (e.g., B2B command sequence) by the circuit 220. In an example, the logical combination may comprise a logical NOR. For example, the signals DQS_RX_EN and GAP1_SMOOTH may be presented to inputs of a 2-input NOR gate 402 and the output of the gate 402 may be used as the signal CTRL.

In some embodiments, an optional logic gate 404 may be implemented to combine the output of the gate 402 with a third control signal (e.g., FORCE_DFE_FIFO_RESET). The signal FORCE_DFE_FIFO_RESET may be implemented by a static configuration bit. When the signal FORCE_DFE_FIFO_RESET is asserted (e.g., a logical HIGH or 1), a value in the data latches of the DFE FIFO buffer may be latched (e.g., as a logical 1) rather than reflecting samples of the signal DATA_RX. In an example, the gate 404 may be implemented as a 2-input OR gate. In embodiments implementing the gate 404, an output of the gate 404 may be utilized as the signal CTRL. Other types of logic gates may be utilized accordingly to implement the gates 402 and 404, depending upon the particular active logic levels of the signals DQS_RX_EN, GAP1_SMOOTH, and FORCE_DFE_FIFO_RESET.

Figure 7:
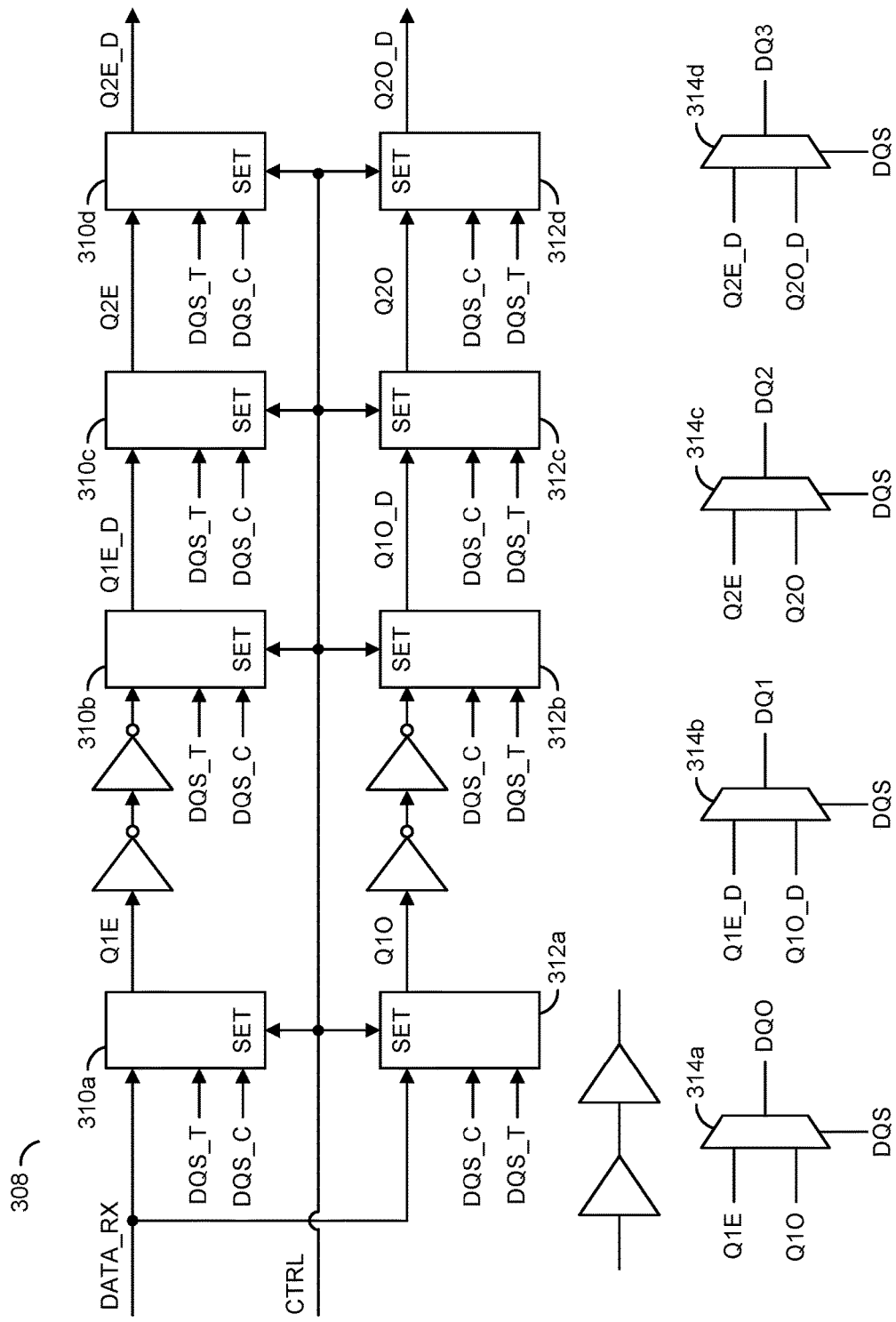
FIG. 7 is a diagram illustrating an example implementation of a double data rate (DDR) first-in-first-out (FIFO) data buffer of the decision feedback equalizer (DFE) of FIG. 6.

Referring to FIG. 7, a diagram is shown illustrating an example implementation of a double data rate (DDR) first-in-first-out (FIFO) data buffer 308 of the decision feedback equalizer (DFE) 306 of FIG. 5. In various embodiments, the FIFO data buffer 308 of the DFE 306 may be configured to latch even and odd data samples on rising and falling edges, respectively, of the signal DQS. In an example where four taps are implemented, the DFE 306 may comprise a number of even sample latches 310a-310d, a number of odd sample latches 312a-312d, and a number of multiplexers 314a-314d. The particular input signal communicated to the output of each of the multiplexers 314a-314d is generally determined by the signal DQS. The latches 310a-310d and 312a-312d may be clocked by true and complement versions (e.g., DQS_T and DQS_C) of the signal DQS. Each of the latches 310a-310d and 312a-312d may have a load input (e.g., SET) that receives the signal CTRL. Although the DFE 306 is shown having four taps/latches in the example illustrated in FIG. 7, other numbers of taps/latches (e.g., 2, 3, 4, 5, 6, etc.) may be implemented accordingly to meet the design criteria of a particular implementation.

Referring to FIG. 8, a logic table TABLE 1 is shown illustrating example control operations of the block 220 in accordance with an example embodiment of the invention. In an example, custom behavior of a number of taps (e.g., 1-4) of the DFE 306 may be controlled based upon a number of static configuration bits (e.g., from the CSR 222) and a number of dynamic signals (e.g., generated by the command sequence detector 220 using a finite state machine). In the example embodiment illustrated in FIG. 8, a first row generally represents a custom behavior when a spacing between two write commands is greater than one DQ dead cycle, a second row generally represents a custom behavior when a spacing between two write commands is equal to one DQ dead cycle, a third row generally represents a custom behavior when a preamble sampling of tap 1 is forced (statically asserted), and a fourth row generally represents a custom behavior when back-to back commands (to the same device) are detected. The spacing of one DQ dead cycle in the DDR protocol generally corresponds to two data bits (e.g., illustrated in FIG. 13B by data values DX and DY).

When the command to command (e.g., W2W) spacing is one DQ dead cycle, the signal DQS is continuous and the DFE can be allowed to freerun. When the command to command (e.g., W2W) spacing is greater than one DQ dead cycle, the signal DQS is not continuous and the DFE FIFO data buffer does not reflect channel conditions because no clock is available to sample the data line. When the command to command (e.g., W2W) spacing is greater than one DQ dead cycle, the DFE taps are put in a reset or a warmup condition because no clock is available.

Referring to FIG. 9, a logic table TABLE 2 is shown illustrating an example implementation of the write to write (W2W) spacing determination performed in the block 220 in accordance with an example embodiment of the invention. The DFE circuit 306 in the host receiver generally should know when the signal DQS_RX_EN will be de-asserted for a single clock cycle between two writes so the reset can be masked (or smoothed). In various embodiments, the signal GAP1_SMOOTH is generated by the circuit 220 (e.g., using a finite state machine) to signal when the smoothing should occur. In various embodiments, the smoothing may be enabled by one or more static configuration bits (e.g., DFE_GAP1_SMOOTH_EN or FORCE_DFE_FREERUN). The signal GAP1_SMOOTH is generally held high when the CSR bit FORCE_DFE_FREERUN is set (asserted). When the CSR bit FORCE_DFE_FREERUN is not asserted (cleared) and the CSR bit DFE_GAP1_SMOOTH_EN is set (asserted), the signal GAP1_SMOOTH is generally asserted when the write commands are spaced with one idle cycle (also referred to as one DQ dead cycle) between.

Assertion of the signal GAP1_SMOOTH generally coincides with a signal (e.g., RXSTART) being low for two cycles. The signal DQS_RX_EN is generally low for a single cycle for a given pair of write commands. In an embodiment implementing the DDR4 protocol, this occurs when the first command of the pair is BL8 (command spaced with a command to command delay of 5, subsequently referred to as tCCD=5) or CRC is enabled (commands spaced tCCD=6), and a 1T preamble length is enabled.

When a 2T preamble is enabled in embodiments implementing the DDR4 protocol, the signal GAP1_SMOOTH is not asserted due to the non-consecutive clock preamble pattern 1101 in DDR4. If the commands are sent to different ranks, then the receiver cycle codes also should be considered in addition to the tCCD spacing. The commands could be spaced with tCCD=5 on the BCOM bus (e.g., bus 56), but spread further on the DQS bus due to differences in the cycle codes for rank to rank transactions.

The command sequence detector 220 may be implemented with one or more finite state machines (FSMs). In various embodiments, the command sequence detector 220 may comprise a FSM configured to generate the signal GAP1_SMOOTH on a per nibble basis. In various embodiments, the FSM may be configured to generate the signal GAP1_SMOOTH according to TABLE 2 based upon (i) a number of static configuration bits (e.g., DFE_GAP1_SMOOTH_EN, GAP1_CHG_DAT0_RNK, FORCE_DFE_FREERUN, etc), (ii) a number of effective MRS (e.g., EFFECTIVE HOST WRITE PREAMBLE, MR2.A12 WRITE CRC, and (iii) buffer command information (e.g., LAST WRITE BURST LENGTH, WRITE TO WRITE SPACING, etc.). The number of static configuration bits may be received from the CSR 222. The number of effective MRS may be received from the registered clock driver (RCD) 92. The buffer command information may be received from the data buffer control (DBC) port via the BCOM bus.

The input signal WRITE TO WRITE SPACING may be pre-computed separately from the block 220 by counting a number of clocks from a last write command, saturating at a predetermined point. In an example, hardware may be implemented that may saturate at the predetermined maximum value, and can be initialized to the maximum value where appropriate (e.g., BCKE, power down, reset, etc.). In various embodiments, the signal LAST WRITE BURST LENGTH may be computed from a field (e.g., WR DAT0) for BC4 on the fly, and may have at least three cycles to setup for a next write command. In various embodiments, the output GAP1_SMOOTH may be synchronized to the receive clock domain (e.g., similarly to DQS_RX_EN).

The technique in accordance with the invention described herein can be extended to other cases to assert the signal GAP1_SMOOTH when a next command is gapped by a preamble length of the same type for other protocols. The technique of generating the signal GAP1_SMOOTH may also be utilized in other implementations when the preamble contains a non repeating clock pattern (alternative 0 and 1 pattern every UI) and cannot directly clock data. In some embodiments, one or more DQS transitions from either the preamble or previous transition can be delayed (e.g., to sample data one, two, three, four, five, six, seven, or eight UI later) to capture the data source synchronously from a forwarded clock when DQS is lacking a transition. In some embodiments, an internally or locally generated clock may be used to clock the data lines when the DQS signal is lacking a transition.

Referring to FIG. 10, a diagram is shown illustrating a example of the GAP1_SMOOTH signal generated in a case where tCCD=5 and the command sequence comprises BL8 to BL8. In the waveforms illustrated in FIG. 10, a signal RXSTART is generated by the circuit 220 and is one cycle shorter than the command length (e.g., a hashed box indicates the missing cycle for DDR4 protocol).

Figure 11:
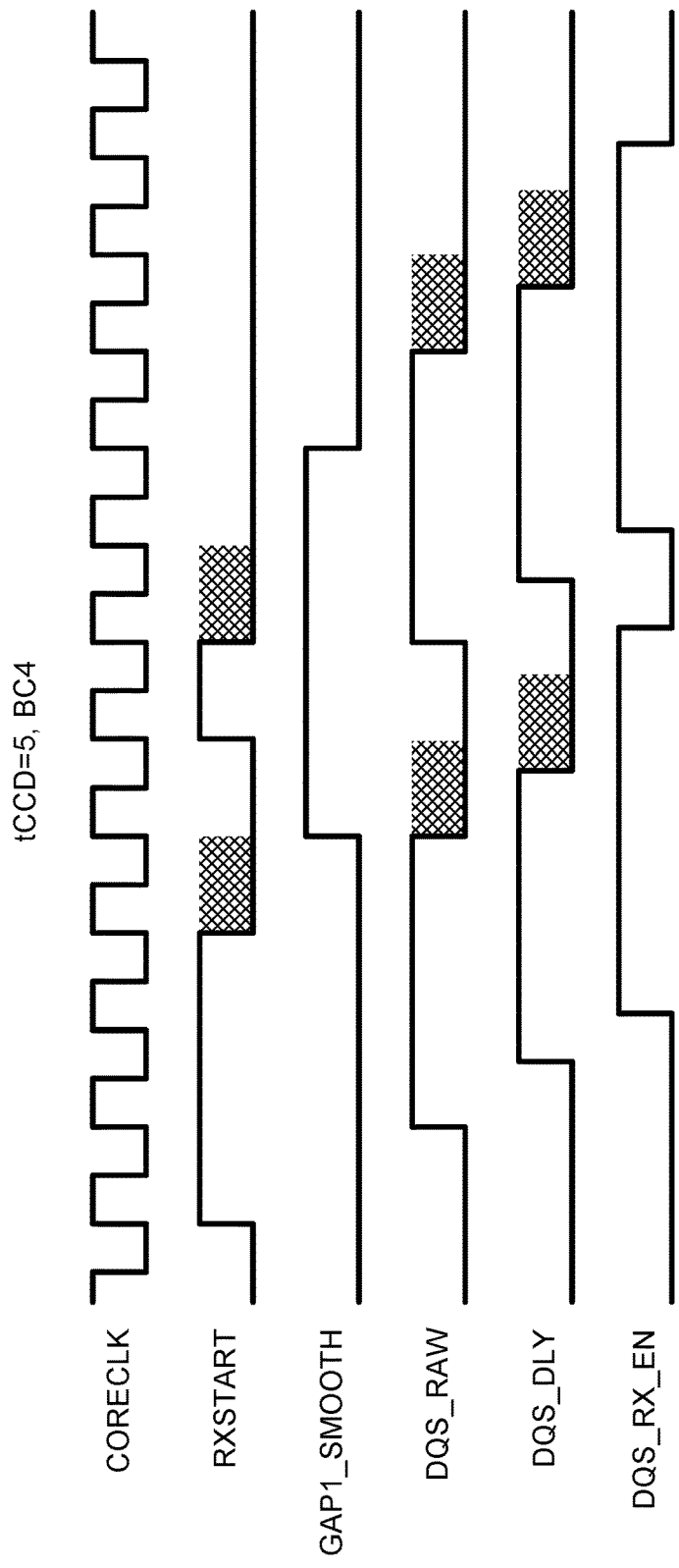
FIG. 11 is a diagram illustrating an operation in accordance with an example embodiment.

Referring to FIG. 11, a diagram is shown illustrating a example of the GAP1_SMOOTH signal generated in a case where tCCD=5 and the command sequence comprises BL8 to BC4. In the waveforms illustrated in FIG. 11, the signal RXSTART is generated by the circuit 220 and is one cycle shorter than the command length (e.g., a hashed box indicates the missing cycle for DDR4 protocol).

Figure 12:
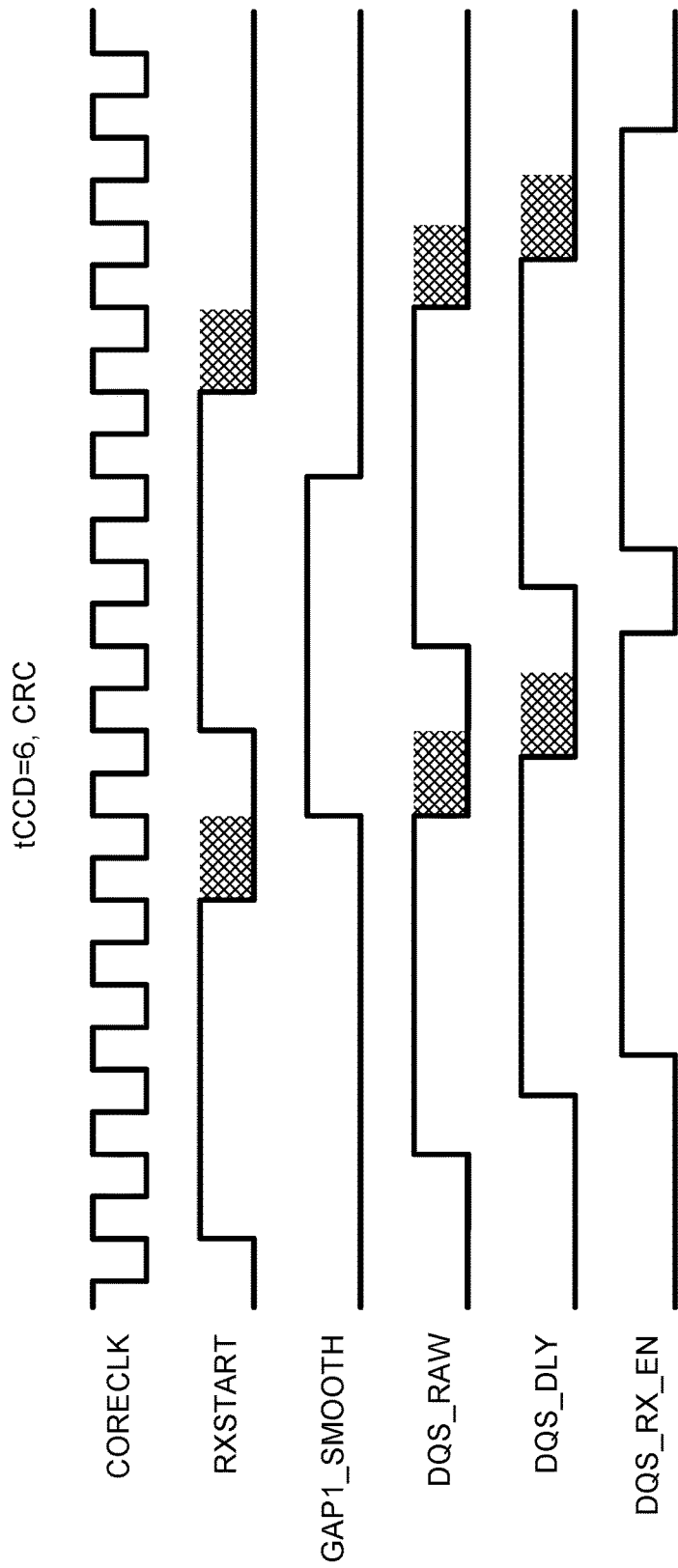
FIG. 12 is a diagram illustrating an operation in accordance with an example embodiment.

Referring to FIG. 12, a diagram is shown illustrating a example of the GAP1_SMOOTH signal generated in a case where tCCD=6, the command sequence comprises BL8 to BL8, and CRC is enabled. In the waveforms illustrated in FIG. 12, the signal RXSTART is generated by the circuit 220 and is one cycle shorter than the command length (e.g., a hashed box indicates the missing cycle for DDR4 protocol).

Figure 13A:
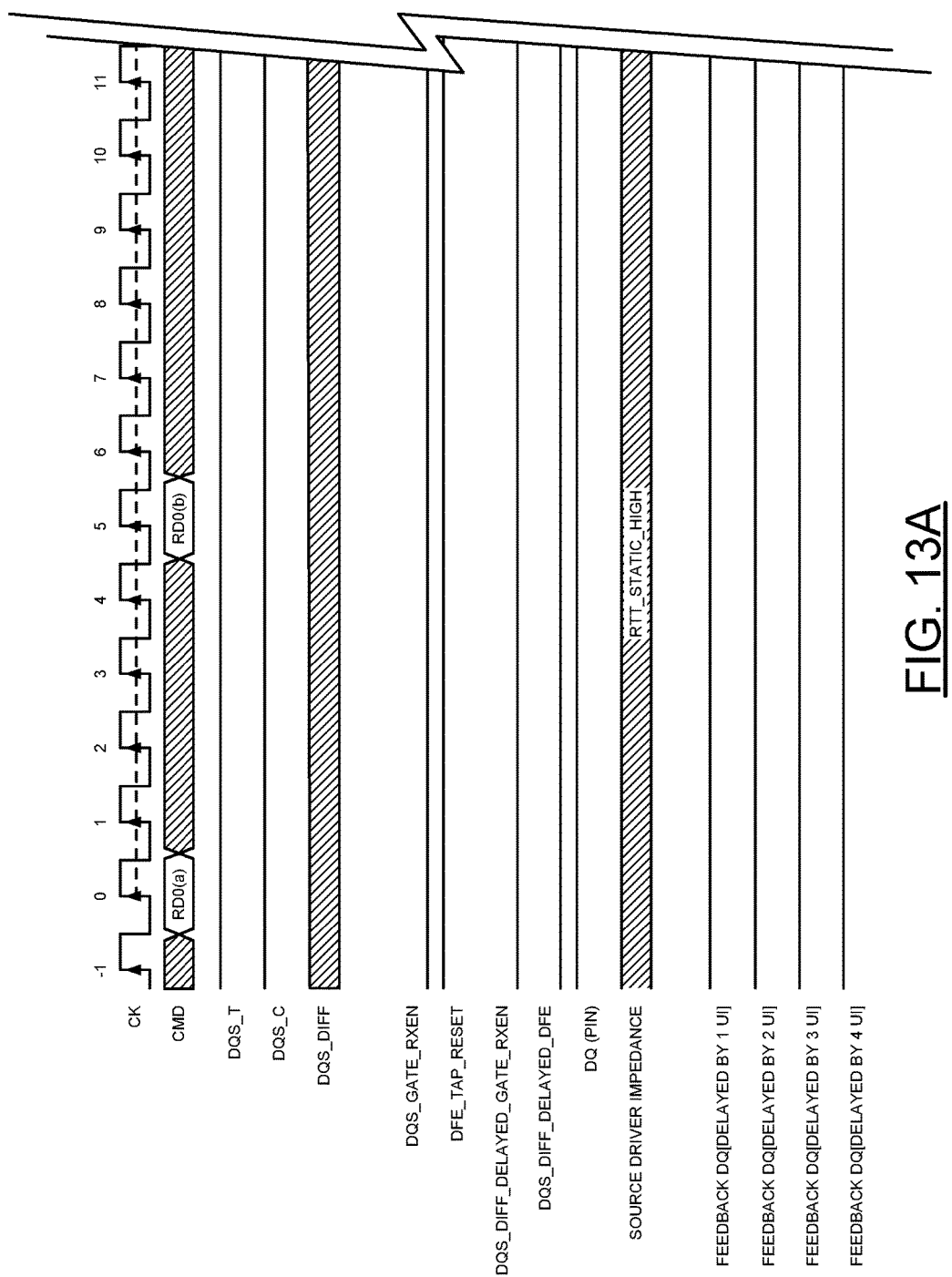
FIGS. 13A-13B are diagrams illustrating an operation in accordance with an example embodiment.
Figure 13B:
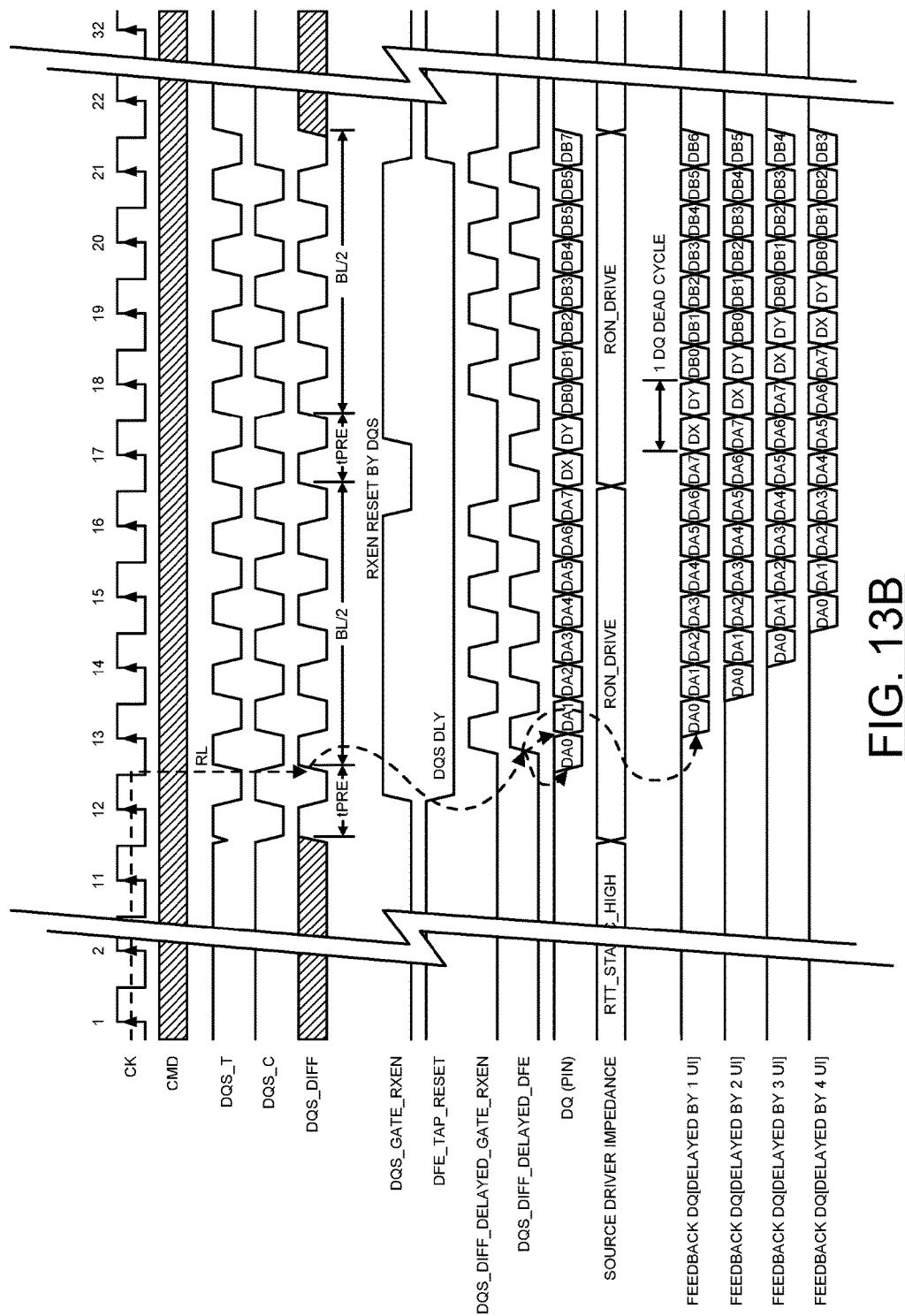

Referring to FIGS. 13A-13B, diagrams are shown illustrating a tap reset logic operation for spaced command special case where tCCD=5 and access is targeted to the same device. When a command is started in one bank group of a DDR4 SRAM with an 8N prefetch, the prefetch must be allowed to finish. This takes the entire cycle time of the group to finish. Switching access from one bank group to another bank group does not have any dependencies on these specifications. Switching access from one bank group to another bank group allows a column to column (or command-to-command on the column side) delay (tCCD) of 4 clock cycles. However, when staying within the same bank group starting at 1,600 Mbps, the tCCD specification is greater than four clock cycles. The tCCD specification is five clocks for 1,600 and 1,866 Mbps, and at 2,133 Mbps, the tCCD specification is six clocks.

Referring to FIG. 13A, a diagram is shown illustrating two commands (e.g., RD0(*a*), RD0(*b*)) targeting the same device separated by five clock cycles (e.g., the case where tCCD=5). In the illustrated case, DQS is continuous, but the data bits (e.g., Dx and Dy) are normally gated in the data path. The control logic of the data buffer should ensure the DFE feedback clock captures the Dx and Dy bits. Thus, no reset should occur between the commands, and the RON drive level (e.g., RON DRIVE) on the DQ lines during preamble transmission should not be Rtt (see FIG. 13B).

Figure 14A:
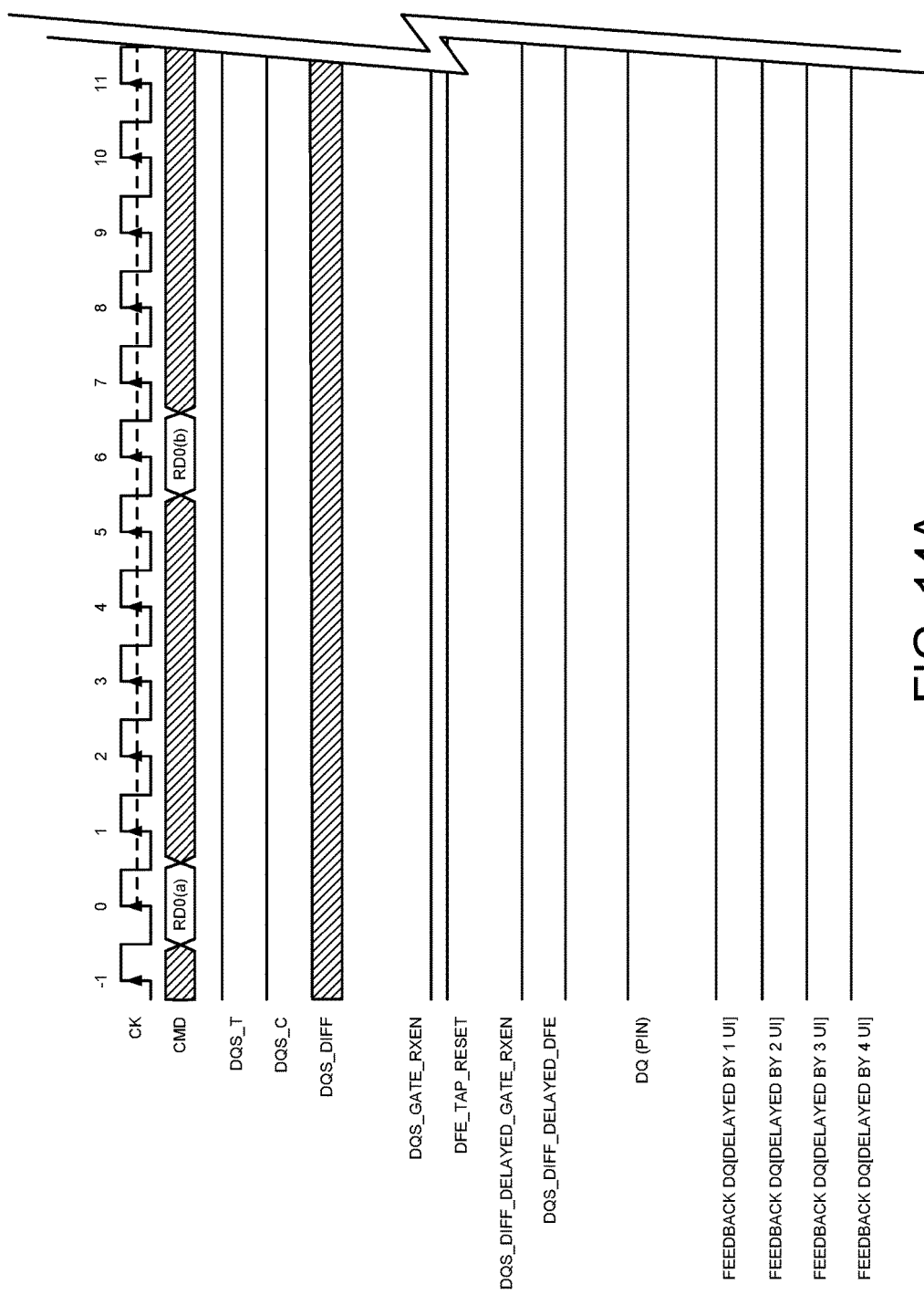
FIGS. 14A-14B are diagrams illustrating an operation in accordance with an example embodiment.
Figure 14B:
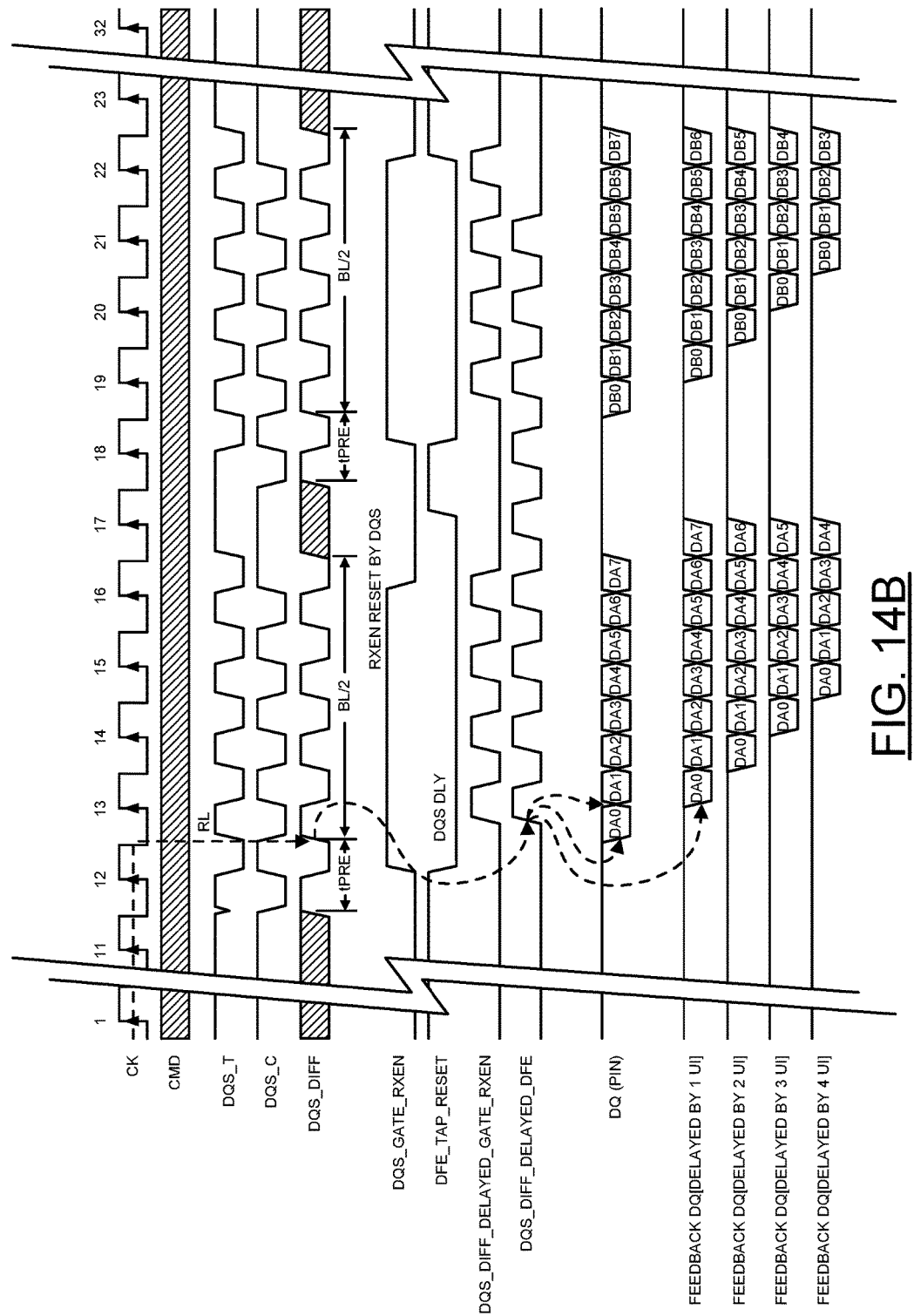

Referring to FIGS. 14A-14B, diagrams are shown illustrating a tap reset logic operation in the case where tCCD=6 in the same device. Staying within the same bank group at, e.g., 2,133 Mbps, needs six clock cycles between the column commands. However, only 4 clock cycles are needed to transfer the data (illustrated in FIGS. 14A and 14B). Two clock cycles, or 33% of the bus bandwidth, becomes unusable, and DQS is now discontinuous. Tap reset on receive and drive logic on transmit (e.g., drive high during DQS preamble) need to agree. DQ should be driven high during a preamble following a non-consecutive DQS edge.

Figure 15A:
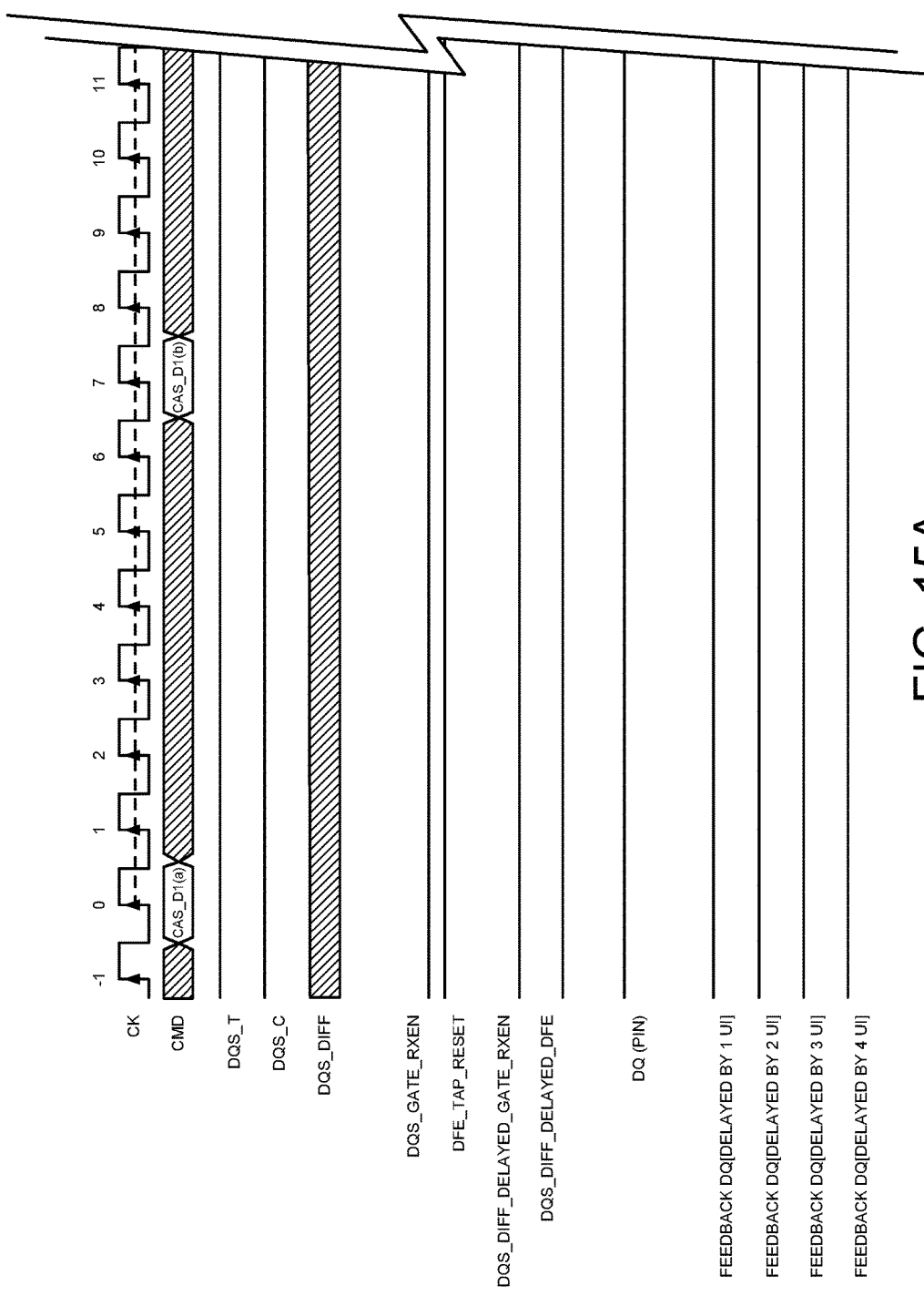

Referring to FIGS. 15A-15B, diagrams are shown illustrating a tap reset logic operation in the case where different devices/command types are involved. Referring to FIG. 15A, when different devices/command types (e.g., device to device, type to type, tRRDD, or tRWDD) are involved, a previous command with sufficient space leads to no inter symbol interference (ISI) on the next command. However, aggressive command spacings near or above current guidelines may influence tap 3 or tap 4 coefficients in 1T PRE. This effect may be mitigated (e.g., traded off) in software and in hardware by a warmup period (e.g., nullify taps 3 and 4 contributions until sufficient bits are sent).

Figure 16:
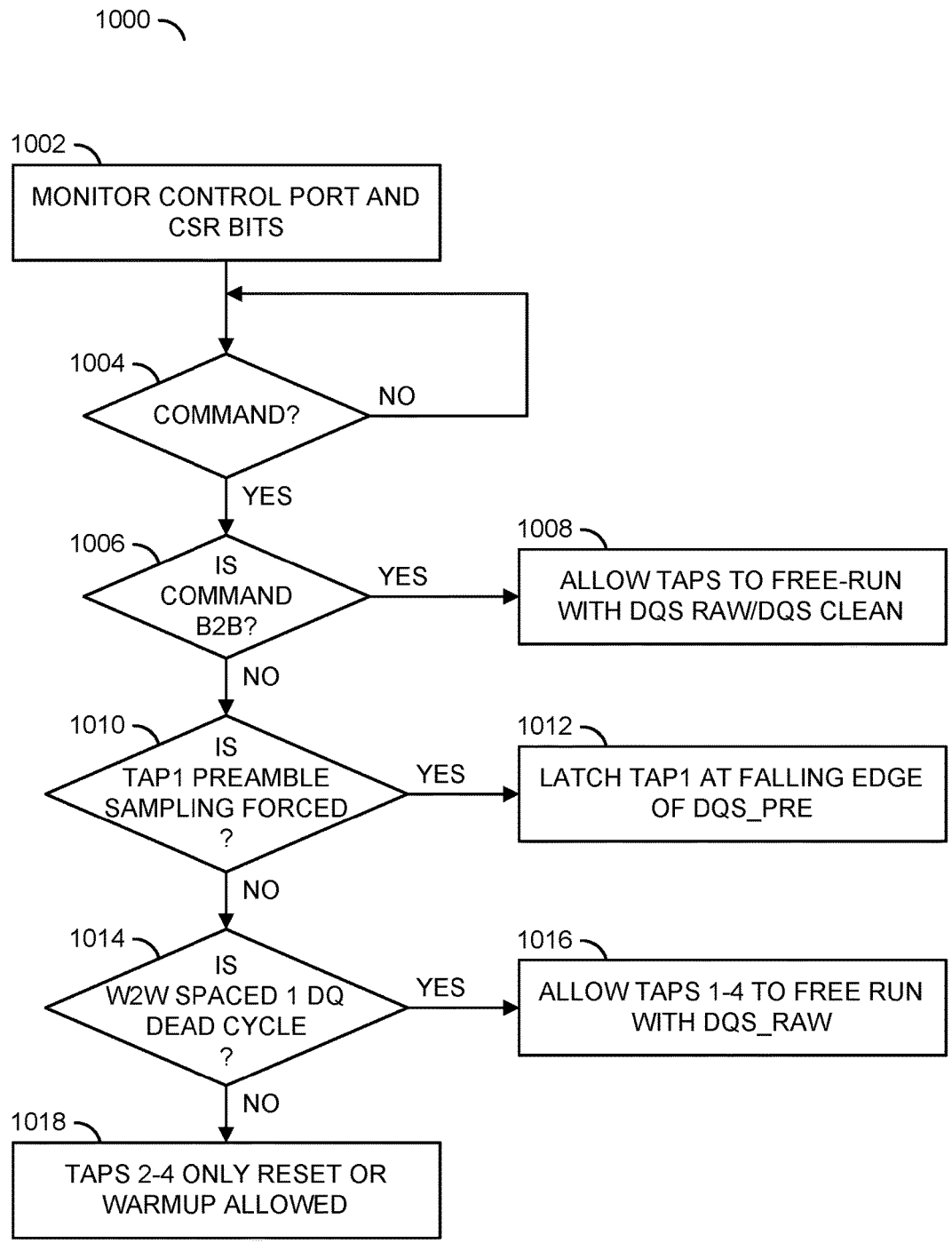
FIG. 16 is a flow diagram illustrating a control process in accordance with an example embodiment of the invention.

Referring to FIG. 16, a flow diagram is shown illustrating a control process in accordance with an example embodiment of the invention. In various embodiments, a process (or method) 1000 may be implemented to control the taps of the DFE 306. In an example, the process 1000 may comprise a number of steps (or states) 1002 to 1018. In the step 1002, the process 1000 may monitor a control port and control status register (CSR) bits to detect a command sequence. In a step 1004, the process 1000 may determine whether a command sequence has been detected. If no command sequence has been received, the process 1000 continues to monitor the control port and CSR bits. If a command sequence has been received, the process 1000 moves to a step 1006. In the step 1006, the process 1000 determines whether the command is a back to back (b2b) command. If the command is a b2b command, the process 1000 moves to a step 1008 where the taps of the DFE are allowed to free run with DQS RAW and DQS CLEAN.

If the command is not a b2b command, the process 1000 moves to a step 1010. In the step 1010, the process 1000 determines whether Tap1 preamble sampling is forced. If Tap1 preamble sampling is forced, the process 1000 moves to a step 1012 and the value of Tap1 of the DFE 306 is latched at the falling edge of DQS_PRE. If Tap1 preamble sampling is not forced, the process 1000 moves to a step 1014. In the step 1014, the process 1000 determines whether a write command to write command (W2W) spacing is 1 DQ dead cycle. If the write to write command is spaced 1 DQ dead cycle, the process 1000 moves to a step 1016 where taps 1-4 of the DFE 306 are allowed to freerun with the signal DQS_RAW. If the write to write command spacing is greater than 1 DQ dead cycle, the process 1000 moves to the step 1018 where taps 2-4 only reset for warmup.

Figure 17:
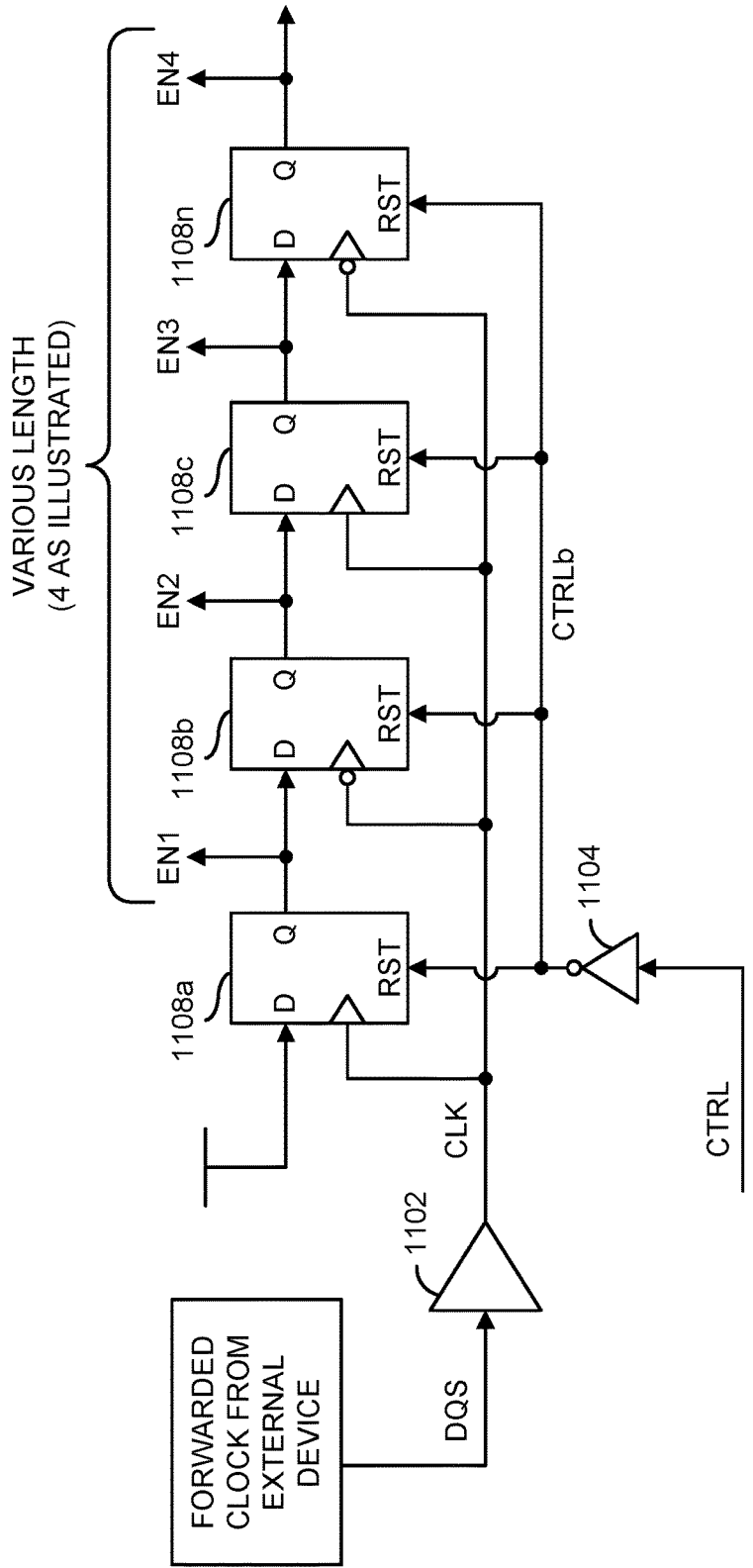
FIG. 17 is a diagram illustrating an enable signal generation circuit in accordance with an embodiment of the invention.

Referring to FIG. 17, a diagram is shown illustrating an enable signal generation circuit in accordance with an example embodiment of the invention. In various embodiments, enable signals may be generated to provide a delay in an onset of equalization. The enable signals may be generated based on the forwarded clock from the external device (e.g., DQS) and the control signal CTRL described above. In an example, the DFE 306 may be configured to apply zero volts (or no equalization) to the data line or signal (e.g., DQi_RCV) during a predetermined delay controlled by the enable signals. The predetermined delay may be user programmable (e.g., using configuration bits). In various embodiments, a number of tap enable signals (e.g., EN1, . . . , ENn) may be implemented to provide a desired range of delay.

In various embodiments, the a number of options (e.g, Option0, Option1, Option2, etc.) may be implemented. In various embodiments, the options may determine the number of tap enable signals and which taps of the DFE 306 are controlled by which tap enable signals. In an example, TABLE 3 below illustrates an example implementation with three example options.

TABLE 3

| OPTION 0 | OPTION 1 | OPTION 2 |
|---|---|---|
| 1) EN1 → TAP2 | 1) EN1 → TAP1 | 1) EN1 → TAP3 |
| 2) EN2 → TAP3 | 2) EN2 → TAP2 | 2) EN2 → TAP4 |
|  | 3) EN3 → TAP3 | ENX → TAP (X + C) |
|  | 4) EN4 → TAP4 |  |
|  | *EN# → TAP# |  |

As will be apparent to a skilled artisan, the techniques disclosed herein may be extended to any number of enable signals and taps, and combinations thereof.

In an example, a circuit 1100 may be implemented to generate four tap enable signals (e.g., EN1-EN4). In an example, the circuit 1100 may comprise a block (or circuit) 1102, a block (or circuit) 1104, and a number of blocks (or circuits) 1108a-1108n. The block 1102 may be implemented as a buffer/driver circuit. The block 1104 may be implemented as an inverter. The blocks 1108a-1108n may be implemented as D flip-flops. However, other devices may be implemented accordingly to meet the design criteria of a particular implementation. In various embodiments, the blocks 1108a, 1108c, etc. may be configured to latch data on a rising (positive) edge of a clock input signal (e.g., CLK) and the blocks 1108b, 1108n, etc. may be configured to latch an input on a falling (negative) edge of the clock input signal CLK.

A forwarded clock from an external device (e.g., DQS) may be presented to an input of the block 1102. An output of the block 1102 may present the signal CLK. The control signal CTRL may be presented to a first input of the block 1104. The signal CTRL is generally configured to indicate when the signal DQS meets the predetermined criteria. An output of the block 1104 may present a signal (e.g., CTRLb) to a reset input (e.g., RST) of each of the blocks 1108a-1108n. When the signal CTRLb is asserted (e.g., a logic 0 or LOW), the blocks 1108a-1108n are configured to present a logic LOW at a respective Q output. When the signal RST is de-asserted (e.g., a logic 1 or HIGH), the blocks 1108a-1108n are configured to latch an input level in response to a rising edge or falling edge, respectively, of the signal CLK.

The signal CLK may be presented to a clock input of each of the blocks 1108a-1108n. A data (D) input of the block 1108 may be tied to a power supply positive voltage. A Q output of the block 1108a may be connected to a D input of the block 1108b. A Q output of the block 1108b may be connected to a D input of the block 1108c. A Q output of the block 1108c may be connected to a D input of the block 1108n. Additional blocks 1108 may be connected similarly. In an example, the outputs of each of the blocks 1108a-1108n may implement enable signals (e.g., EN1, . . . , EN4). Although the circuit 1100 has been illustrated generating four enable signals, other numbers of enable signals may be implemented accordingly to meet the design criteria of a particular application.

Figure 18:
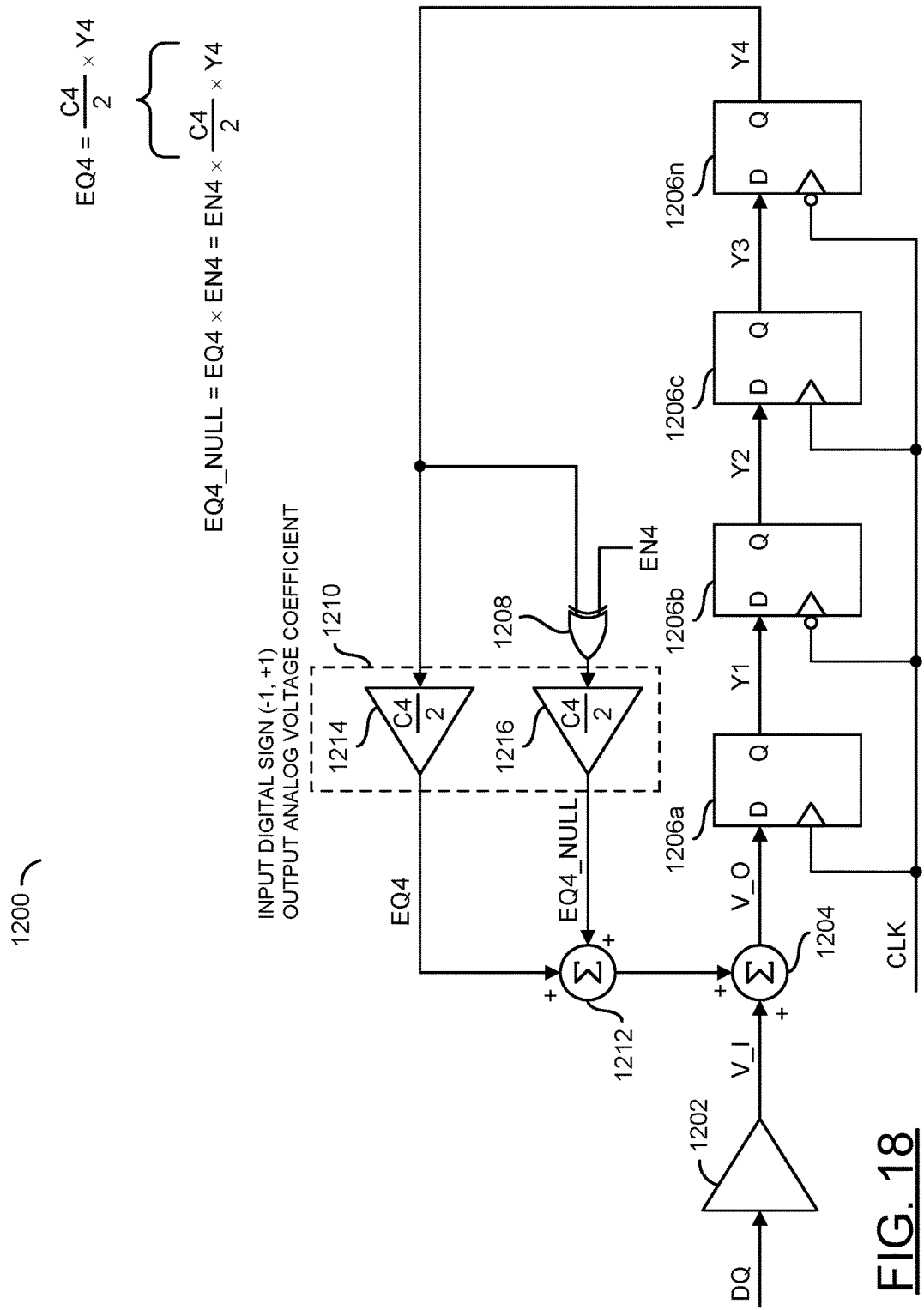
FIG. 18 is a diagram illustrating an equalization control circuit in accordance with an embodiment of the invention.

Referring to FIG. 18, a diagram is shown illustrating an equalization circuit in accordance with an embodiment of the invention. In various embodiments, an equalization circuit 1200 may be implemented. The circuit 1200 may comprises a block (or circuit) 1202, a block (or circuit) 1204, a number of blocks (or circuits) 1206a-1206n, a block (or circuit) 1208, a block (or circuit) 1210, and a block (or circuit) 1212. The block 1202 may be implemented as a buffer/driver circuit. The block 1204 may be implemented as a summing circuit (e.g., an adder). The blocks 1206a-1206n may be implemented as storage elements (e.g., D flip-flops, registers, latches, sample-and-hold units, etc). The block 1208 may comprise a logic gate. In an example, the block 1208 may be implemented as an Exclusive-OR gate. The block 1210 may be implemented as an analog voltage coefficient output circuit. The block 1212 may be implemented as a summing circuit (e.g., an adder). In various embodiments, the blocks 1208 and 1210 may be implemented for each tap of the DFE 206 whose contribution may be delayed. The circuitry illustrated is limited to tap 4 for clarity.

A data signal (e.g., DQ) may be presented to an input of the block 1202. An output of the block 1202 may present a signal (e.g., V_I) to a first input of the block 1204. An output of the block 1204 may present a signal (e.g., V_O) to a D input of the block 1206a. A clock input of each of the blocks 1206a-1206n may receive the signal CLK. In various embodiments, the blocks 1206a, 1206c, etc. are configured as positive edge triggered and the blocks 1208b, 1208d, etc. are configured as negative edge triggered. An output of the block 1206a may be presented to an input of the block 1206b. An output of the block 1206b may be presented to an input of the block 1206c. An output of the block 1206c may be presented to an input of the block 1206n. An output of the block 1206n may be connected to a first input of the block 1208 and a first input of the block 1210. A second input of the block 1208 may receive the signal EN4. An output of the block 1208 may be presented to a second input of the block 1210.

A first output of the block 1210 may present a signal (e.g., EQ4). A second output of the block 1210 may present a signal (e.g., EQ4_NULL). The signal EQ4 may comprise a weighted version of the signal Y4. The signal EQ4 may be presented to a first input of the block 1210. The signal EQ4-NULL may comprise a weight version of the signal Y4 with a sign determined by EN4. The signal EQ4_NULL may be presented to a second input of the block 1210. An output of the block 1210 is presented to a second input of the block 1204. In one example, the block 1210 may be implemented as a pair of amplifiers 1214 and 1216. In various embodiments, the amplifiers 1214 and 1216 may have a gain of C4/2, where C4 represents a tap weight of tap 4. The particular gain provided by the block 1210 corresponds with the particular tap or taps and enable signals implemented. For example, to delay contribution of a tap n, enable signal ENn would be selected and the amplifiers in the block 1210 would have gains of Cn/2. In some embodiments, multiple instances of the blocks 1208 and 1210 may be implemented in parallel and a multiplexer may be used to select the particular enable signal or signals used to delay the respective contributions from the multiple instances.

Figure 19:
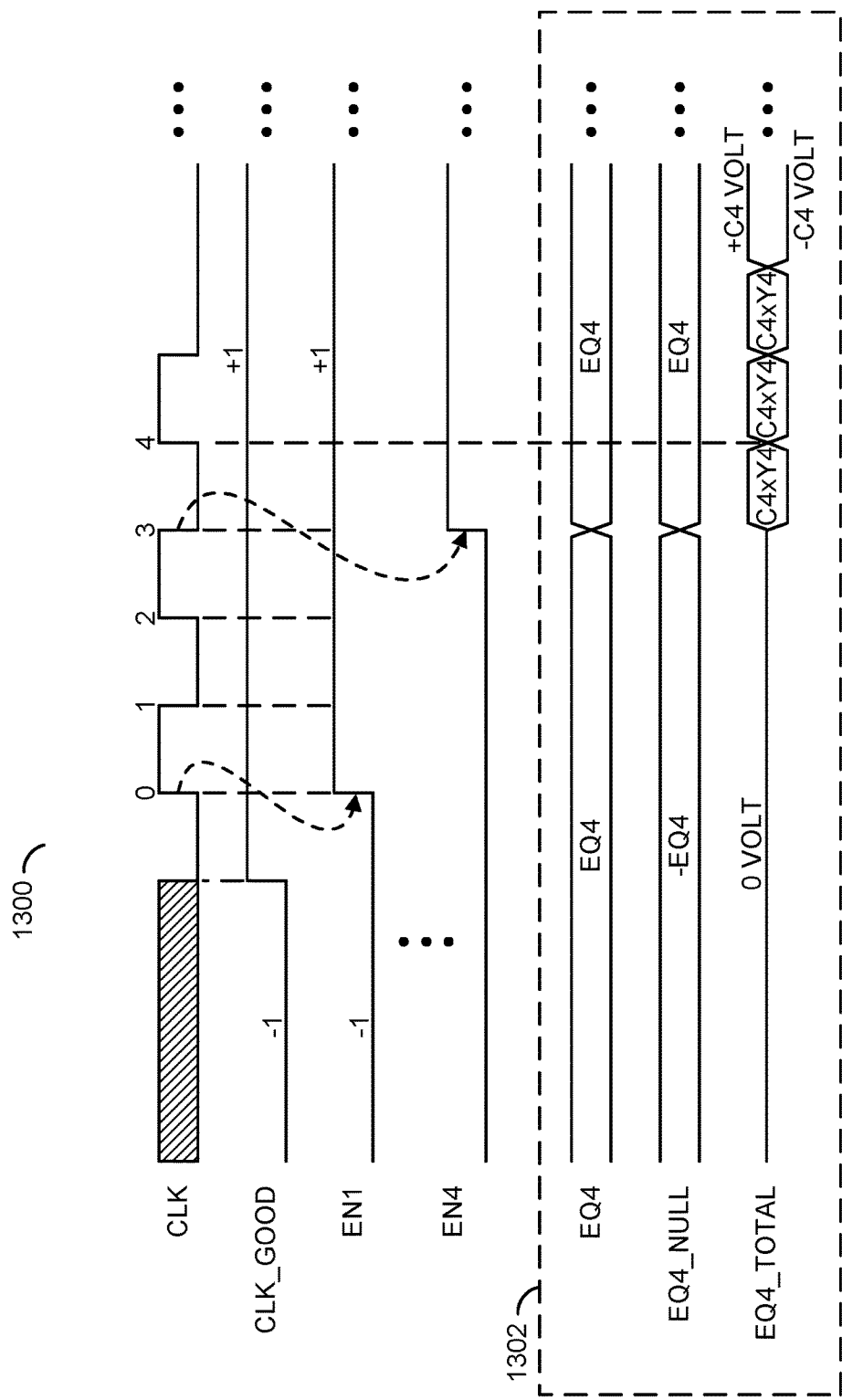
FIG. 19 is a diagram illustrating an example operation of the equalization circuit of FIG. 17.

Referring to FIG. 19, a timing diagram 1300 is shown illustrating an example operation of the enable signal generation circuit of FIG. 17 and the equalization circuit of FIG. 18. A dashed box 1302 highlights an equalization example in accordance with an example embodiment of the invention. In the example shown, while the signal DQS does not meet predetermined criteria, the signal CTRL may be set to −1 (or logic LOW or 0). The enable signals EN1-EN4 are similarly set to −1 (a logic LOW or 0). When the signal DOS meets the predetermined criteria, the signal CTRL rises to a level of +1 (or logic HIGH). When the signal CTRL rises to the level of +1, each of the signals EN1-EN4 transition from the level of −1 to a level of +1 (logic HIGH) in response to respective edges of the signal CLK.

While the signal EN4 is in the −1 state, the output EQ4 of the equalizer block 1210 presents a signal EQ4 and the output EQ4_NULL of the equalizer block 1210 presents a complement (e.g., −EQ4). The sum of the signals EQ4 and EQ4_NULL cancel each another out, providing an equalization (e.g., EQ4_TOTAL) of zero volts (e.g., Y4*C4/2+ (−Y4*C4/2)=0). When the signal EN4 rises to the +1 level, the output EQ4_NULL becomes the same as the output EQ4 and the sum of EQ4 and EQ4_NULL becomes twice the value of EQ4. Therefore, when the signal EN4 rise to the level +1, the equalization contribution provided by the signal EQ4_TOTAL switches from zero volts to a value of C4×Y4 (e.g., Y4*C4/2+Y4*C4/2=C4*Y4), where Y4 represents the sampled data at tap 4 and C4 represents the tap weight associated with Tap 4. The contributions of the other taps may be controlled accordingly.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications (e.g., DDR5, etc.).

The various signals of the invention are generally "on" (e.g., a digital HIGH, or 1) or "off" (e.g., a digital LOW, or 0, or −1). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a receiver circuit comprising a decision feedback equalizer (DFE); and
   a data buffer circuit configured to initialize a condition of said receiver circuit in response to a control signal prior to reception of a command sequence associated with a directed access to a memory system, wherein (i) said control signal indicates detection of a non-consecutive clock associated with a start of said command sequence and (ii) said data buffer circuit generates one or more tap enable signals configured to determine a number of clock cycles during which a contribution of one or more taps of said decision feedback equalizer (DFE) are delayed.

2. The apparatus according to claim 1, wherein said data buffer circuit initializes said receiver circuit by delaying said contributions of said one or more taps of said decision feedback equalizer (DFE) of said receiver circuit until a data value has been registered in a corresponding data flop of each of said one or more taps.

3. The apparatus according to claim 1, wherein said data buffer circuit initializes said receiver circuit by delaying said contributions of said one or more taps of said decision feedback equalizer (DFE) of said receiver circuit for a predetermined number of clock cycles.

4. The apparatus according to claim 1, wherein said data buffer circuit sets an output of said decision feedback equalizer to zero volts for a predetermined number of clock cycles in response to said control signal.

5. The apparatus according to claim 1, wherein said data buffer circuit comprises an enable signal generating circuit configured to generate said one or more tap enable signals based on a forwarded clock from an external device and said control signal.

6. The apparatus according to claim 5, wherein said enable signal generating circuit comprises a delay line comprising a plurality of delay elements, each configured to generate one of said tap enable signals.

7. The apparatus according to claim 6, wherein:
   when said control signal is in a first state, an output of each of said plurality of delay elements is set to a first logic level; and
   when said control signal is in a second state, a second logic level presented at an input of said delay line is passed along said delay elements of said delay line on each transition of said forwarded clock.

8. The apparatus according to claim 1, wherein said contributions of said one or more taps of said decision feedback equalizer are generated by respective amplifier circuits.

9. The apparatus according to claim 8, wherein said respective amplifier circuits are configured to present a weighted tap value in response to a first state of a corresponding tap enable signal and a null tap value in response to a second state of the corresponding tap enable signal.

10. The apparatus according to claim 1, wherein said control signal is generated by a finite state machine based upon one or more static configuration bits, contents of one or more mode registers, and command sequence information.

11. A method of initializing a receiver circuit of a memory system comprising:
   generating a control signal indicating detection of a non-consecutive clock associated with a start of a command sequence associated with a directed access to said memory system; and
   prior to reception of a first data bit associated with said command sequence, generating one or more tap enable signals to determine a number of clock cycles a contribution of one or more taps of a decision feedback equalizer (DFE) of said receiver circuit are delayed.

12. The method according to claim 11, wherein said receiver circuit is initialized by delaying said contributions of said one or more taps of said decision feedback equalizer (DFE) until a data value has been registered in a corresponding data flop of each of said one or more taps.

13. The method according to claim 11, wherein said receiver circuit is initialized by delaying said contributions of said one or more taps of said decision feedback equalizer (DFE) for a predetermined number of clock cycles.

14. The method according to claim 11, wherein an output of said decision feedback equalizer (DFE) is set to zero volts for a predetermined number of clock cycles in response to said control signal.

15. The method according to claim 11, further comprising:
   generating said one or more tap enable signals using a delay line comprising a plurality of delay elements.

16. The method according to claim 15, wherein said tap enable signals are generated based on a forwarded clock from an external device and said control signal.

17. The method according to claim 16, further comprising:
   when said control signal is in a first state, setting an output of each of said plurality of delay elements to a first logic level.

18. The method according to claim 17, further comprising:
   when said control signal is in a second state, passing a second logic level presented at an input of said delay line along said delay elements of said delay line on each transition of said forwarded clock.

\* \* \* \* \*